United States Patent
Lin et al.

(10) Patent No.: US 11,251,284 B2
(45) Date of Patent: Feb. 15, 2022

(54) DUMMY GATE CUTTING PROCESS AND RESULTING GATE STRUCTURES

(71) Applicant: Taiwan Semiconductor Manufacturing Co., Ltd., Hsinchu (TW)

(72) Inventors: Shih-Yao Lin, New Taipei (TW); Chih-Han Lin, Hsinchu (TW); Shu-Uei Jang, Hsinchu (TW); Ya-Yi Tsai, Hsinchu (TW); Shu-Yuan Ku, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/867,867

(22) Filed: May 6, 2020

(65) Prior Publication Data

US 2021/0126109 A1  Apr. 29, 2021

Related U.S. Application Data

(60) Provisional application No. 62/927,559, filed on Oct. 29, 2019.

(51) Int. Cl.
*H01L 29/66* (2006.01)
*H01L 21/8234* (2006.01)
*H01L 27/088* (2006.01)

(52) U.S. Cl.
CPC ......... *H01L 29/66545* (2013.01); *H01L 21/823431* (2013.01); *H01L 21/823481* (2013.01); *H01L 27/0886* (2013.01); *H01L 29/6681* (2013.01)

(58) Field of Classification Search
CPC .......... H01L 29/66545; H01L 29/6681; H01L 21/823431; H01L 21/823481; H01L 27/0886
See application file for complete search history.

(56) References Cited

U.S. PATENT DOCUMENTS

| 8,760,948 B2 | 6/2014 | Tao et al. |
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |

(Continued)

FOREIGN PATENT DOCUMENTS

| KR | 20160114010 A | 10/2016 |
| KR | 20170051120 A | 5/2017 |
| KR | 20180119092 A | 11/2018 |

*Primary Examiner* — Christine A Enad
(74) *Attorney, Agent, or Firm* — Slater Matsil, LLP

(57) ABSTRACT

A method includes forming a dummy gate stack, etching the dummy gate stack to form an opening, depositing a first dielectric layer extending into the opening, and depositing a second dielectric layer on the first dielectric layer and extending into the opening. A planarization process is then performed to form a gate isolation region including the first dielectric layer and the second dielectric layer. The dummy gate stack is then removed to form trenches on opposing sides of the gate isolation region. The method further includes performing a first etching process to remove sidewall portions of the first dielectric layer, performing a second etching process to thin the second dielectric layer, and forming replacement gates in the trenches.

20 Claims, 37 Drawing Sheets

(56) References Cited

U.S. PATENT DOCUMENTS

| | | |
|---|---|---|
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 9,917,085 B2 | 3/2018 | Lin et al. |
| 10,170,332 B2 | 1/2019 | Huang |
| 10,658,485 B2 | 5/2020 | Lin et al. |
| 10,840,144 B2 | 11/2020 | Chang et al. |
| 2017/0345820 A1* | 11/2017 | Lin .................. H01L 29/66818 |
| 2018/0308949 A1* | 10/2018 | Lin ...................... H01L 21/845 |
| 2019/0378903 A1* | 12/2019 | Jeon .................... H01L 27/0886 |
| 2021/0020644 A1* | 1/2021 | Paul .................... H01L 29/0673 |

* cited by examiner

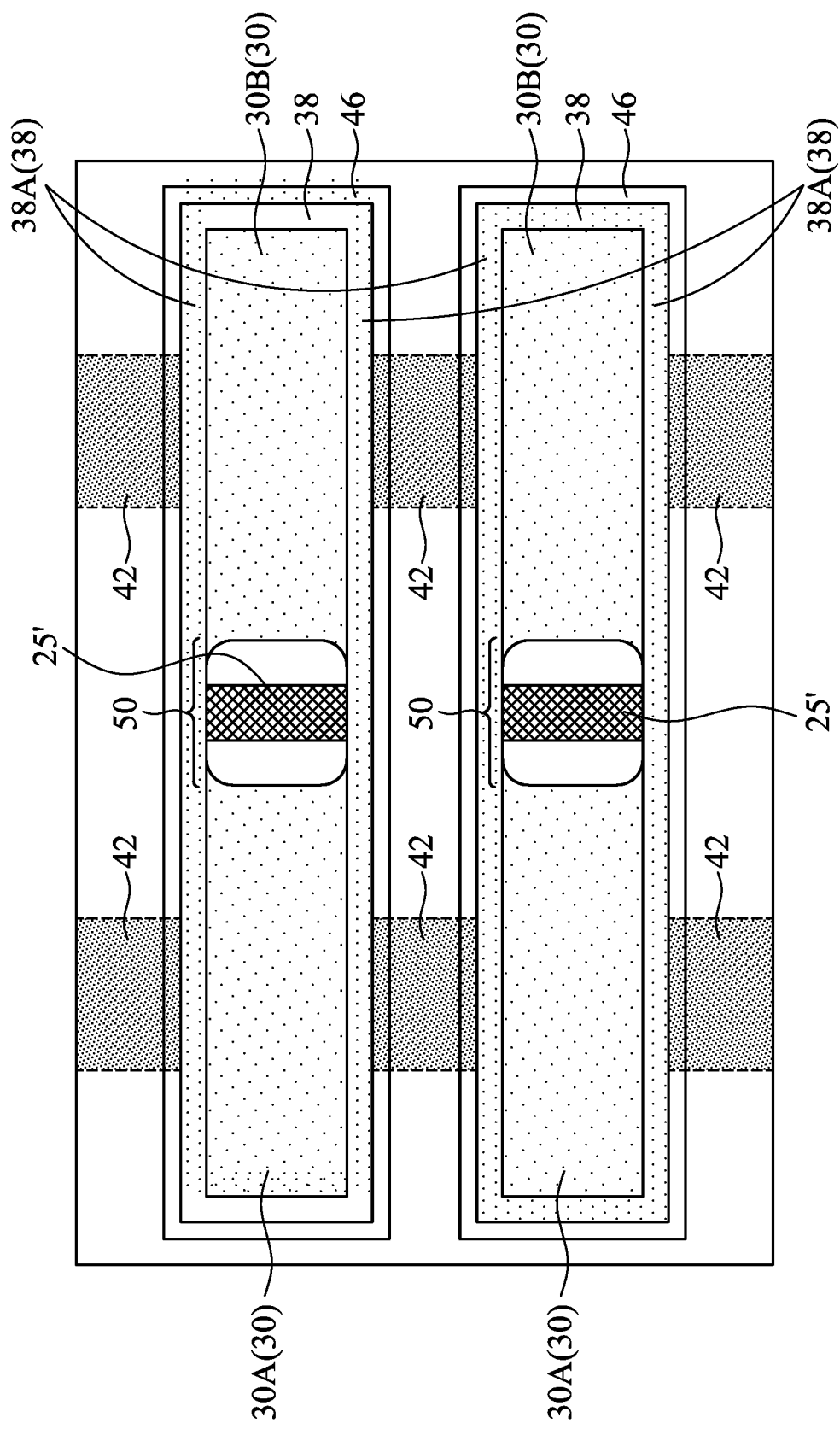

DUMMY GATE CUTTING PROCESS AND RESULTING GATE STRUCTURES

PRIORITY CLAIM AND CROSS-REFERENCE

This application claims the benefit of the U.S. Provisional Application No. 62/927,559, filed Oct. 29, 2019, and entitled "Metal Gate Fill Process and Resulting Gate Structures," which application is hereby incorporated herein by reference.

BACKGROUND

Metal-Oxide-Semiconductor (MOS) devices are basic building elements in integrated circuits. An existing MOS device typically has a gate electrode having polysilicon doped with p-type or n-type impurities, using doping operations such as ion implantation or thermal diffusion. The work function of the gate electrode was adjusted to the band-edge of the silicon. For an n-type Metal-Oxide-Semiconductor (NMOS) device, the work function may be adjusted to close to the conduction band of silicon. For a P-type Metal-Oxide-Semiconductor (PMOS) device, the work function may be adjusted to close to the valence band of silicon. Adjusting the work function of the polysilicon gate electrode can be achieved by selecting appropriate impurities.

MOS devices with polysilicon gate electrodes exhibit carrier depletion effect, which is also referred to as a poly depletion effect. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

The poly depletion problem may be solved by forming metal gate electrodes or metal silicide gate electrodes, wherein the metallic gates used in NMOS devices and PMOS devices may also have band-edge work functions. Since the NMOS devices and PMOS devices have different requirements regarding the work functions, dual-gate CMOS devices are used.

In the formation of the metal gate electrodes, a long dummy gate is formed first, which is then etched, so that portions of the long dummy gate are separated from each other. A dielectric material may then be filled into the opening left by the etched portion of the long dummy gate. The dielectric material is then polished, leaving a portion of the dielectric material between the remaining portions of the dummy gate. The separated portions of the dummy gate are then replaced with metal gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-4, 5A, 5B, 6, 7A, 7B, 7C, 8A, 8B-1, 8B-2, 8C, 9A, 9B, 10, 11A, 11B, 12A, 12B, and 12C illustrate the cross-sectional views, the top views, and the perspective views of intermediate stages in the formation of Fin Field-Effect Transistors (FinFETs) and gate isolation regions on a dummy fin in accordance with some embodiments.

DETAILED DESCRIPTION

Figure 1:
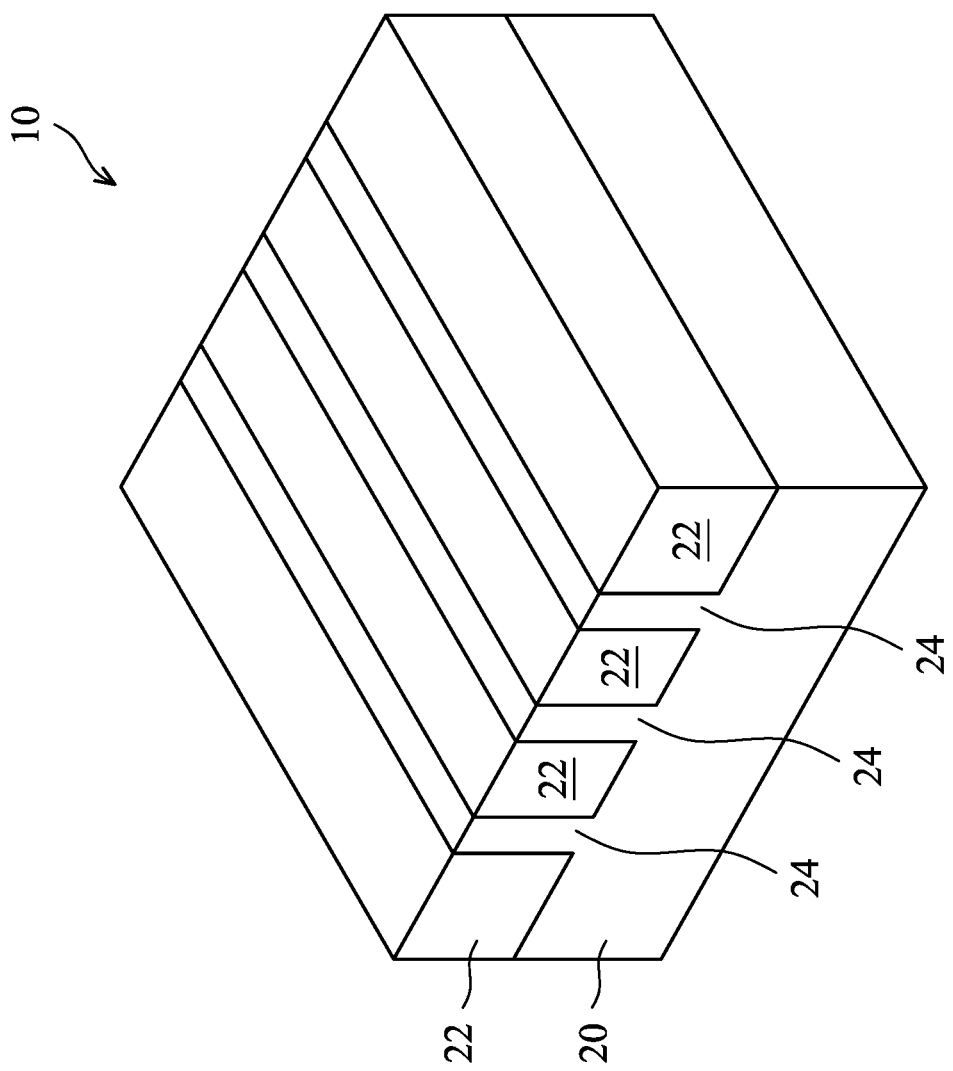

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Gate isolation regions, Fin Field-Effect Transistors (FinFETs), and the method of forming the same are provided in accordance with various embodiments. The intermediate stages in the formation of the gate isolation regions are illustrated in accordance with some embodiments. Some variations of some embodiments are discussed. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

In accordance with some embodiments of the present disclosure, the formation of gate isolation regions includes etching a dummy gate to form an opening, filling the opening with a first dielectric layer and a second dielectric layer, and performing a planarization process. The dummy gate is then removed. A first etching process is preformed to remove the exposed sidewall portions of the first dielectric layer. A second etching process is then performed to thin the second dielectric layer so that the resulting gate isolation region has a concave top-view shape. Replacement gates are then formed on opposing sides of the gate isolation regions.

FIGS. 1-4, 5A, 5B, 6, 7A, 7B, 7C, 8A, 8B-1, 8B-2, 8C, 9A, 9B, 10, 11A, 11B, 12A, 12B, and 12C illustrate the cross-sectional views of intermediate stages in the formation of FinFETs and gate isolation regions on a dummy fin. The corresponding processes are also reflected schematically in the process flow shown in FIG. 26.

Figure 26:
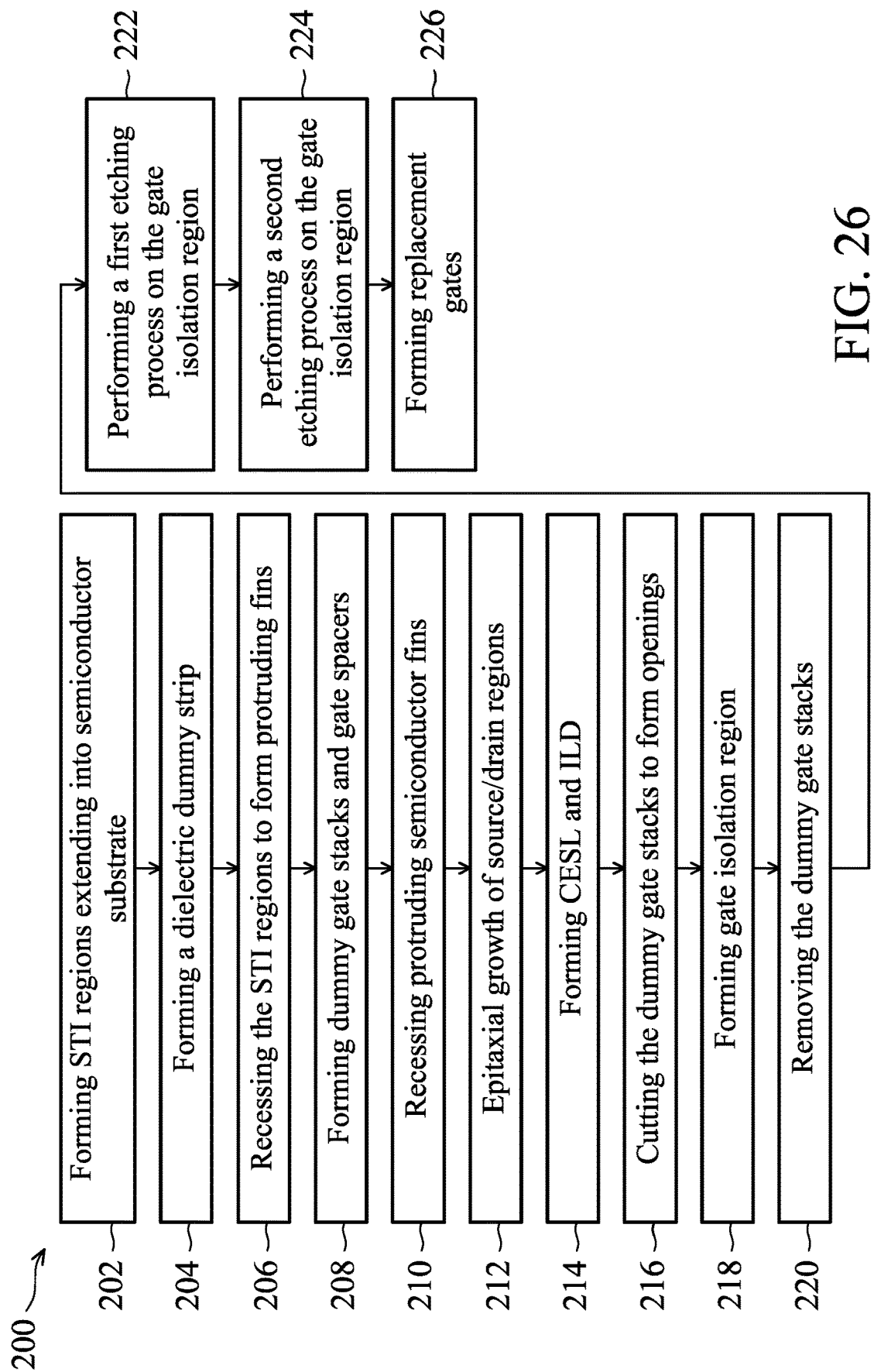
FIG. 26 illustrates a process flow for forming FinFETs and gate isolation regions in accordance with some embodiments.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions are formed to extend from a top surface of substrate 20 into substrate 20. The respective process is illustrated as process 202 in the process flow 200 as shown in FIG. 26. The portions of substrate 20 between neighboring STI regions 22 are referred to as semiconductor strips 24. In accordance with some embodiments of the present disclosure, semiconductor strips 24 are parts of the original substrate 20, and hence the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy process to regrow another semiconductor material in the recesses. Accordingly, semiconductor strips 24 are formed of a semiconductor material different from that of substrate 20. In accordance with some embodiments, semiconductor strips 24 are formed of Si, SiP, SiC, SiPC, SiGe, SiGeB, Ge, or a III-V compound semiconductor such as InP, GaAs, AlAs, InAs, InAlAs, InGaAs, or the like.

STI regions 22 may include a liner oxide (not shown), which may be a thermal oxide formed through the thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), Chemical Vapor Deposition (CVD), or the like. STI regions 22 may also include a dielectric material over the liner oxide, wherein the dielectric material may be formed using Flowable Chemical Vapor Deposition (FCVD), spin-on, or the like.

Figure 2:
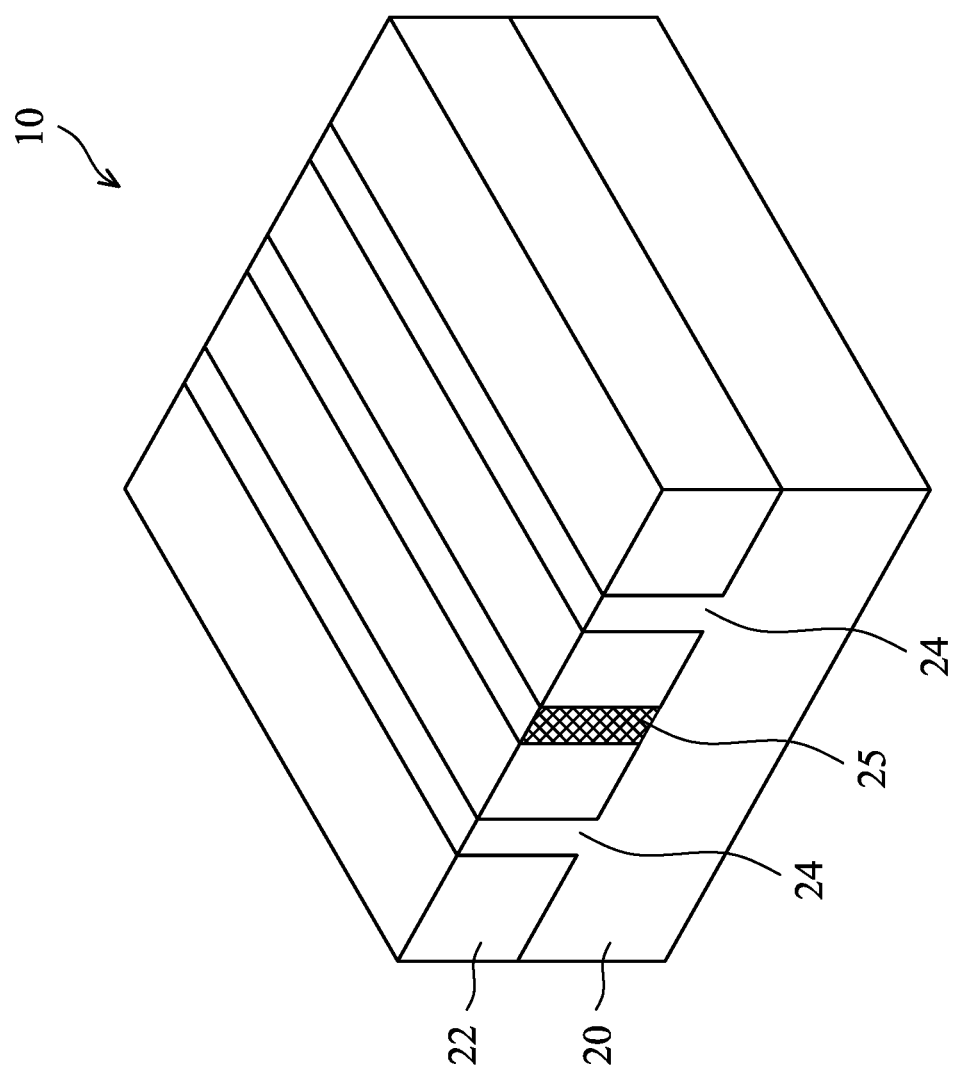

FIG. 2 illustrates the formation of dielectric dummy strip 25, which may be formed by etching one of the semiconductor strips 24 to form a recess, and then filling the recess with a dielectric material. The respective process is illustrated as process 204 in the process flow 200 as shown in FIG. 26. The dielectric material may include or be a high-k dielectric material such as silicon nitride. Also, the material of dielectric dummy strip 25 is selected so that it has a high etching selectivity with relative to the materials of metal gates (such as tungsten and titanium nitride) and the materials of STI regions 22 (such as silicon oxide). In accordance with some embodiments of the present disclosure, the material of dielectric dummy strip 25 includes a silicon-based material such as SiN, SiON, SiOCN, SiC, SiOC, $SiO_2$, or the like. In accordance with alternative embodiments of the present disclosure, the material of dielectric dummy strip 25 includes a metal-based material (oxide or nitride) such as TaN, TaO, HfO, or the like. The bottom surface of dielectric dummy strip 25 may be higher than, level with, or lower than, the bottom surfaces of STI regions 22.

Figure 3:
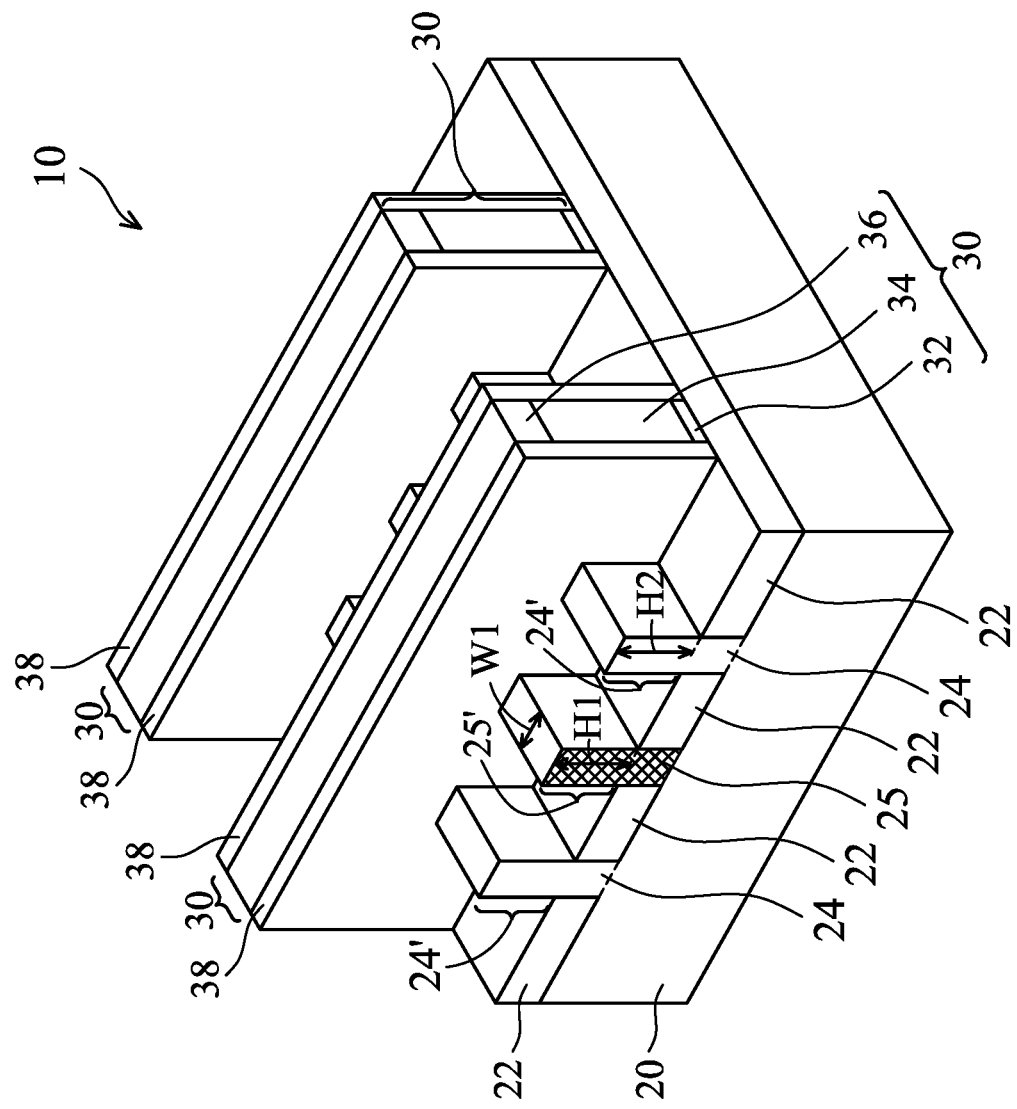

Referring to FIG. 3, STI regions 22 are recessed. The respective process is illustrated as process 206 in the process flow 200 as shown in FIG. 26. The top portions of semiconductor strips 24 and dielectric dummy strip 25 protrude higher than the top surfaces 22A of the remaining portions of STI regions 22 to form protruding semiconductor fins 24' and dielectric dummy fin 25', respectively. The etching may be performed using a dry etching process, wherein HF and $NH_3$ are used as the etching gases. In accordance with alternative embodiments of the present disclosure, the recessing of STI regions 22 is performed through a wet etching process. The etching chemical may include HF solution, for example. The height $H_1$ of dielectric dummy fin 25' may be equal to, greater than, or smaller than, the height $H_2$ of protruding fins 24'. In accordance with some embodiments of the present disclosure, the height $H_1$ of dielectric dummy fin 25' is in the range between about 50 Å and about 1500 Å. The width $W_1$ of dielectric dummy fin 25' may be in the range between about 5 Å and about 500 Å.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Further referring to FIG. 3, dummy gate stacks 30 are formed on the top surfaces and the sidewalls of (protruding) fins 24' and 25'. The respective process is illustrated as process 208 in the process flow 200 as shown in FIG. 26. Dummy gate stacks 30 may include dummy gate dielectrics 32 and dummy gate electrodes 34 over dummy gate dielectrics 32. Dummy gate electrodes 34 may be formed, for example, using polysilicon, and other materials may also be used. Each of dummy gate stacks 30 may also include one (or a plurality of) hard mask layer 36 over dummy gate electrode 34. Hard mask layers 36 may be formed of silicon nitride, silicon oxide, silicon carbo-nitride, or multi-layers thereof. Dummy gate stacks 30 may cross over a single one or a plurality of protruding fins 24' and 25' and STI regions 22. Dummy gate stacks 30 also have lengthwise directions perpendicular to the lengthwise directions of protruding fins 24'.

Next, gate spacers 38 are formed on the sidewalls of dummy gate stacks 30. The respective process is also illustrated as process 208 in the process flow 200 as shown in FIG. 26. In accordance with some embodiments of the present disclosure, gate spacers 38 are formed of a dielectric material such as silicon nitride, silicon oxide, silicon carbo-nitride, silicon oxy-nitride, silicon oxy-carbo-nitride, or the like, and may have a single-layer structure or a multi-layer structure including a plurality of dielectric layers.

Figure 4:
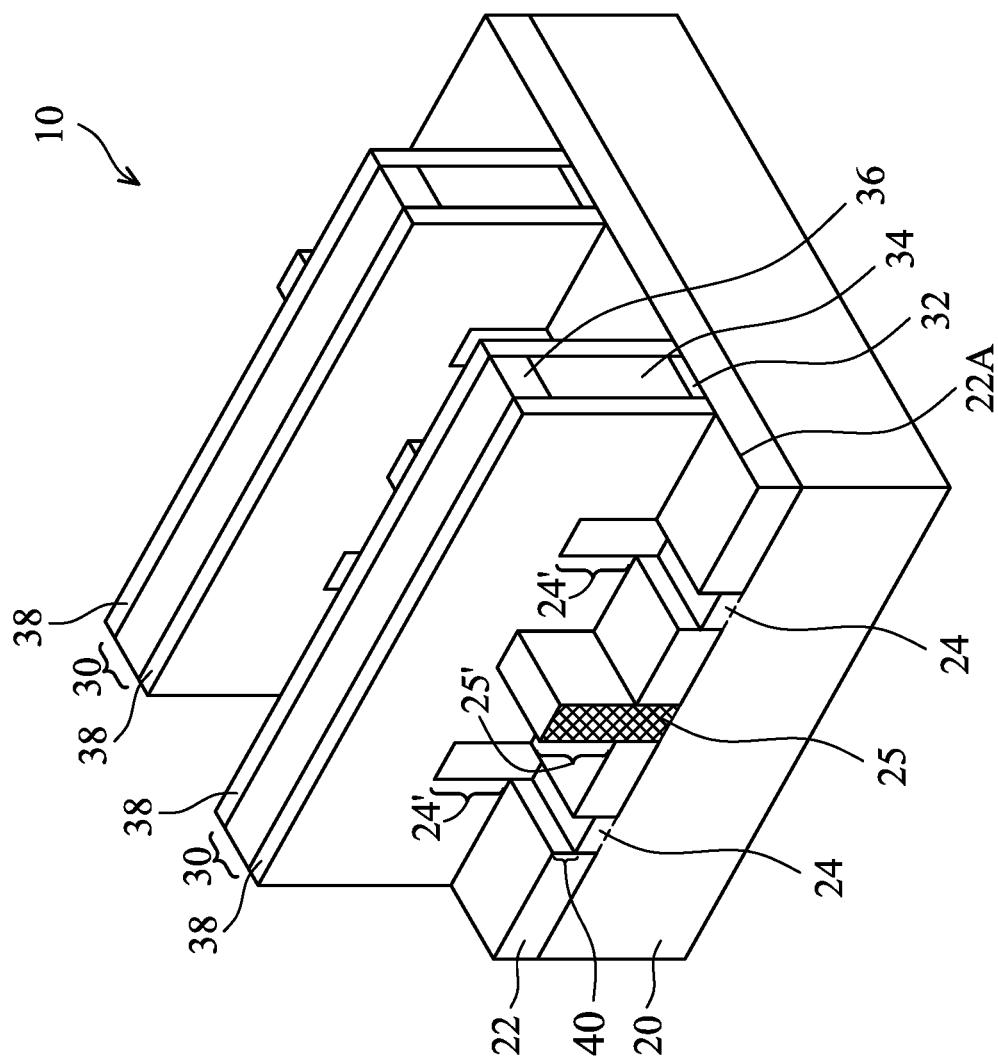

In accordance with some embodiments of the present disclosure, an etching step is performed to etch the portions of protruding fins 24' that are not covered by dummy gate stack 30 and gate spacers 38, resulting in the structure shown in FIG. 4. The respective process is illustrated as process 210 in the process flow 200 as shown in FIG. 26. The recessing may be anisotropic, and hence the portions of fins 24' directly underlying dummy gate stacks 30 and gate spacers 38 are protected, and are not etched. The top surfaces of the recessed semiconductor strips 24 may be lower than the top surfaces 22A of STI regions 22 in accordance with some embodiments. The spaces left by the etched portions of protruding fins 24' are referred to as recesses 40. In the etching process, dielectric dummy fin 25' is not etched.

Figure 5A:
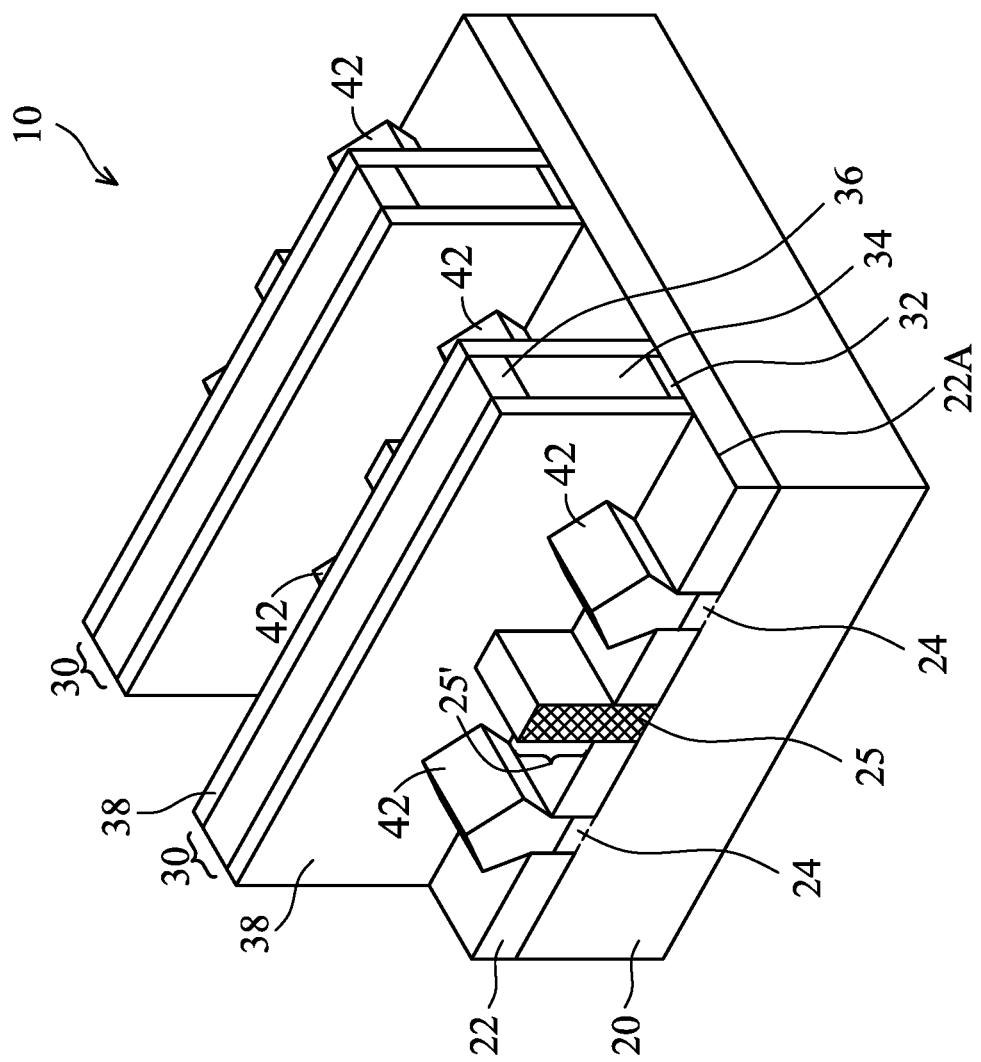

Next, epitaxy regions (source/drain regions) 42 are formed by selectively growing a semiconductor material from recesses 40, resulting in the structure in FIG. 5A. The respective process is illustrated as process 212 in the process flow 200 as shown in FIG. 26. In accordance with some embodiments, epitaxy regions 42 include silicon germanium, silicon, silicon carbon, or the like. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), GeB, or the like may be grown. Conversely, when the resulting FinFET is an n-type FinFET, silicon phosphorous (SiP), silicon carbon phosphorous (SiCP), or the like, may be grown. In accordance with alternative embodiments of the present disclosure, epitaxy regions 42 are formed of a III-V compound semiconductor such as GaAs, InP, GaN, InGaAs, InAlAs, GaSb, AlSb, AlAs, AlP, GaP, combinations thereof, or multi-layers thereof. After epitaxy regions 42 fully fill recesses 40, epitaxy regions 42 start expanding horizontally, and facets may be formed.

Figure 5B:
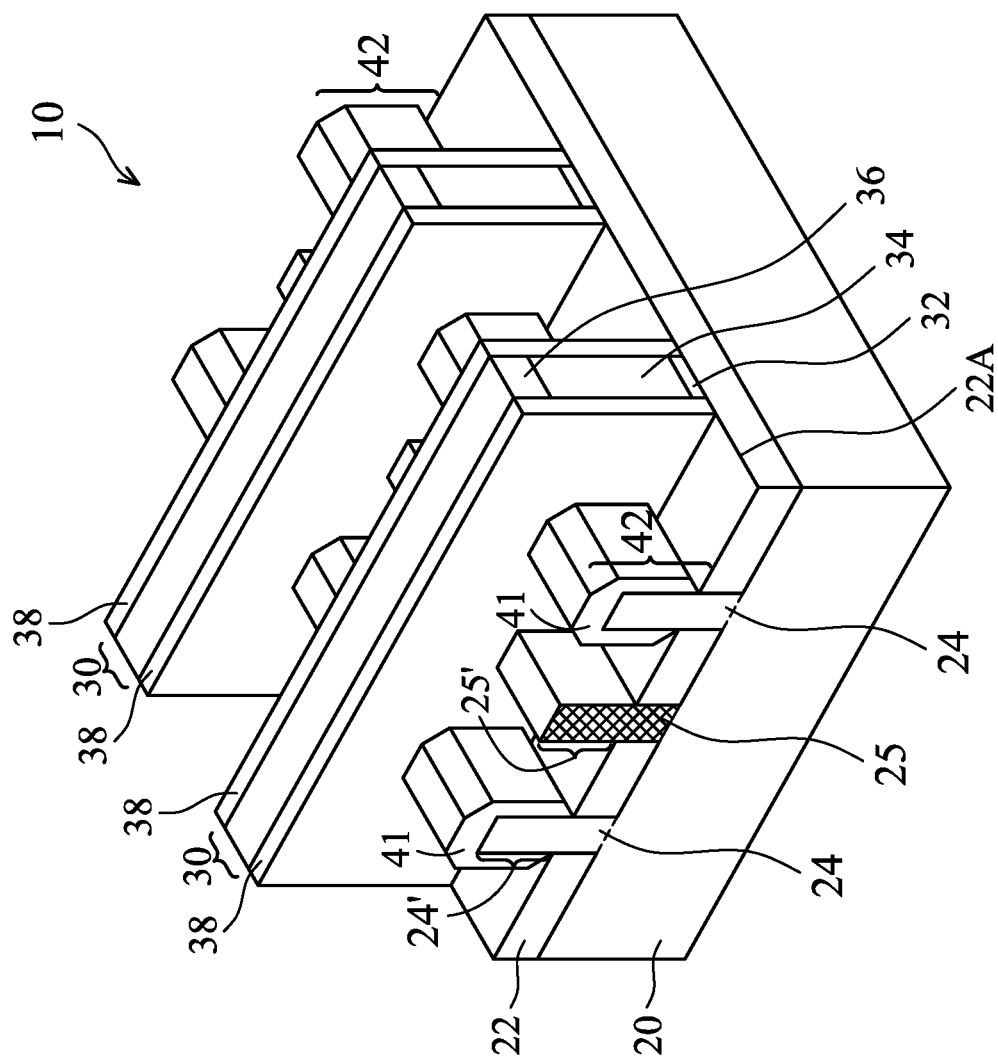

FIG. 5B illustrates the formation of cladding source/drain regions 42 in accordance with alternative embodiments of the present disclosure. In accordance with these embodiments, the protruding fins 24' as shown in FIG. 4 are not recessed, and epitaxy regions 41 are grown on protruding fins 24'. The material of epitaxy regions 41 may be similar to the material of the epitaxy semiconductor material 42 as shown in FIG. 5A, depending on whether the resulting FinFET is a p-type or an n-type FinFET. Accordingly, source/drain regions 42 include protruding fins 24' and the epitaxy region 41. An implantation may (or may not) be performed to implant an n-type impurity or a p-type impurity.

Figure 6:
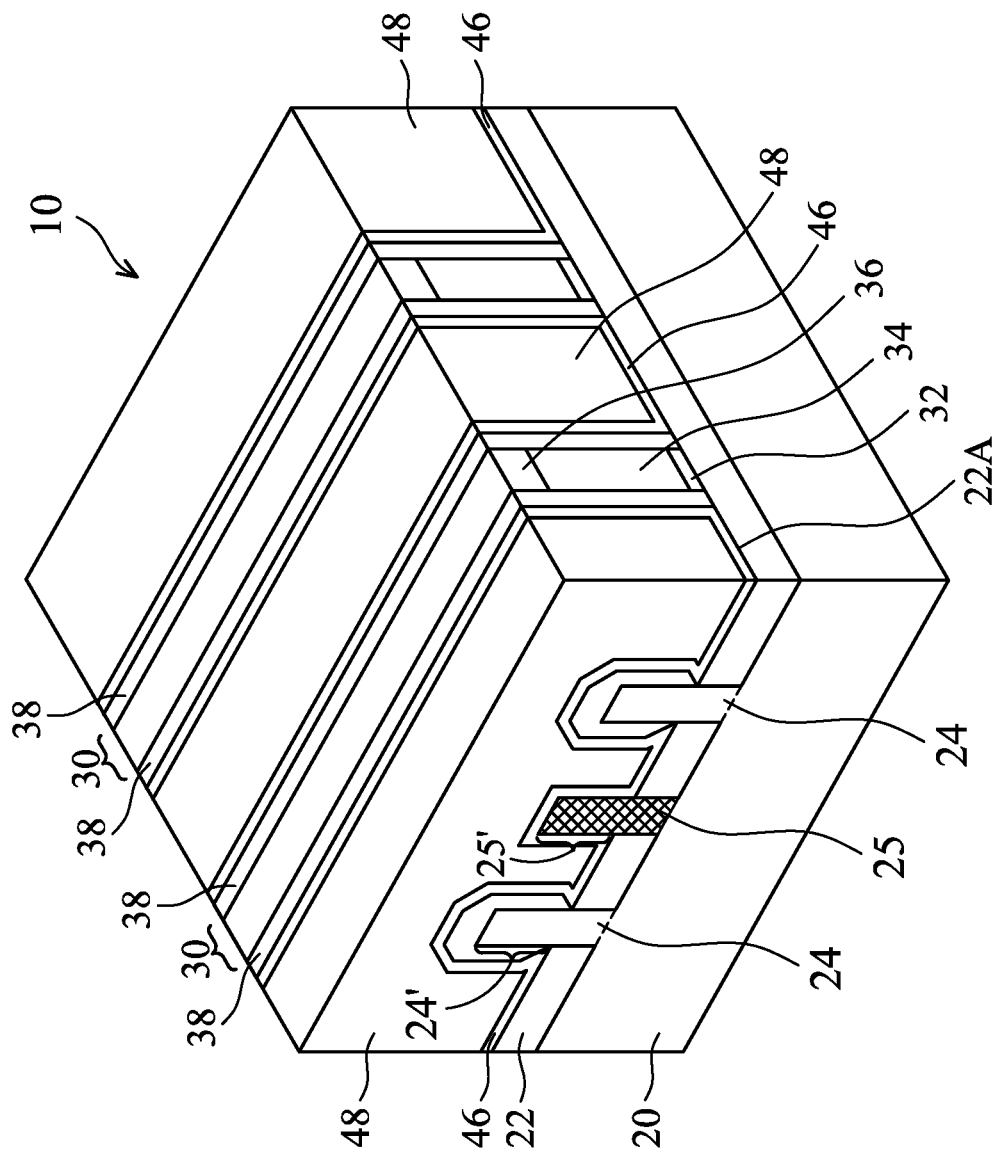

FIG. 6 illustrates a perspective view of the structure after the formation of Contact Etch Stop Layer (CESL) 46 and Inter-Layer Dielectric (ILD) 48. The respective process is illustrated as process 214 in the process flow 200 as shown in FIG. 26. CESL 46 may be formed of silicon nitride, silicon carbo-nitride, or the like. CESL 46 may be formed using a conformal deposition method such as ALD or CVD, for example. ILD 48 may include a dielectric material formed using, for example, FCVD, spin-on coating, CVD, or another deposition method. ILD 48 may also be formed of or comprise an oxygen-containing dielectric material, which may be silicon-oxide based such as silicon oxide, Phospho-Silicate Glass (PSG), Boro-Silicate Glass (BSG), Boron-Doped Phospho-Silicate Glass (BPSG), or the like. A planarization process such as Chemical Mechanical Polish (CMP) process or mechanical grinding process is performed to level the top surfaces of ILD 48, dummy gate stacks 30, and gate spacers 38 with each other. In accordance with some embodiments of the present disclosure, the planarization process stops on the top of hard mask 36. In accordance with alternative embodiments, hard mask 36 is also removed during the planarization process, and the planarization process stops on the top surface of dummy gate electrode 34. Accordingly, in some of subsequent figures, hard mask 36 is represented using a dashed line to indicate it may or may not exist.

Figure 7A:
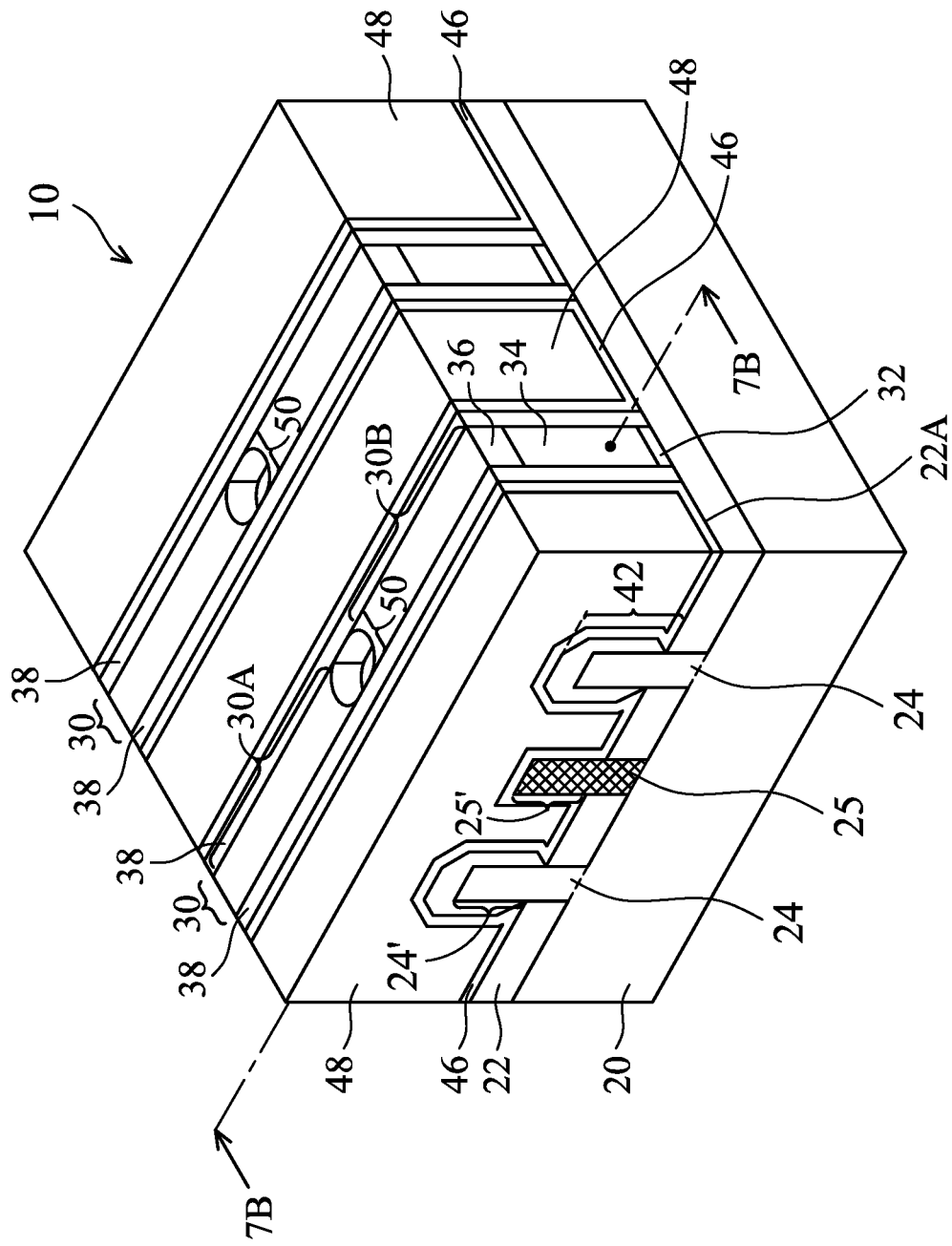
Figure 7B:
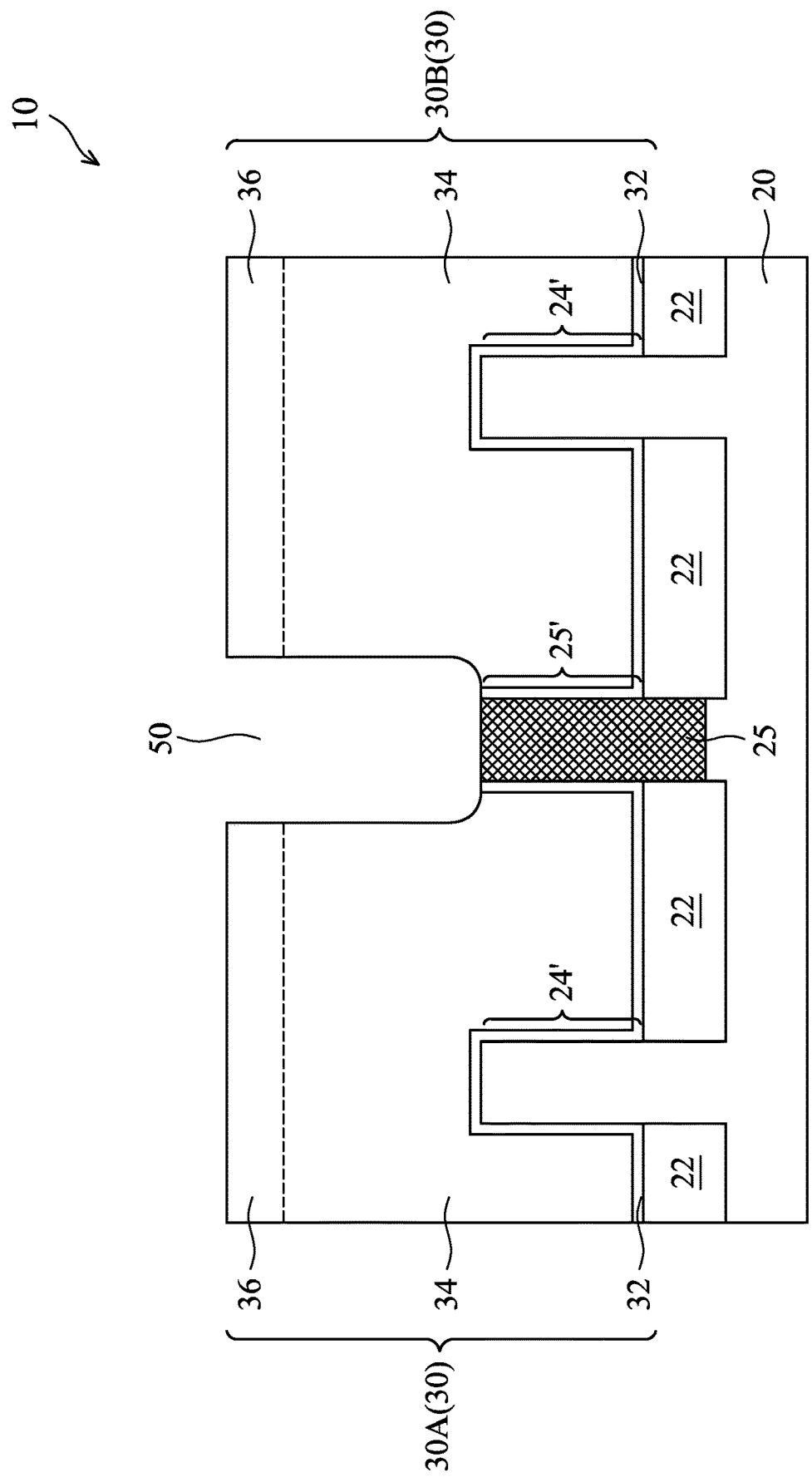

Referring to FIG. 7A, a dummy-gate cutting process is performed by etching dummy gate stacks 30 to form openings 50. The respective process is illustrated as process 216 in the process flow 200 as shown in FIG. 26. Dummy gate stacks 30 are thus separated into discrete portions. To perform the dummy-gate cutting process, an etching mask, which may include a photo resist (not shown), may be formed and patterned. FIG. 7B illustrates a cross-sectional view obtained from the reference cross-sectional 7B-7B as shown in FIG. 7A. In the dummy-gate cutting process, dummy gate stacks 30 are etched in anisotropic processes, until dielectric dummy fin 25' is exposed. As a result, a portion of dummy gate stack 30 is removed. The long dummy gate stack 30 is thus cut into two discrete portions 30A and 30B that are disconnected from each other. Each discrete portion of dummy gate stack 30 may cross over one, two, or more protruding fins 24' in order to form a single-fin FinFET or a multi-fin FinFET. After the etching of dummy gate stack 30, the etching mask is removed, for example, in an ashing process.

FIG. 7C illustrates a top view of a portion of the structure shown in FIG. 7A. Each of openings 50 is formed between corresponding gate spacer portions 38A and 38B, which are the parallel opposite portions of gate spacer 38. Gate spacer portions 38A and 38B have sidewalls exposed to opening 50. Dielectric dummy fin 25' is revealed through openings 50.

Figure 8A:
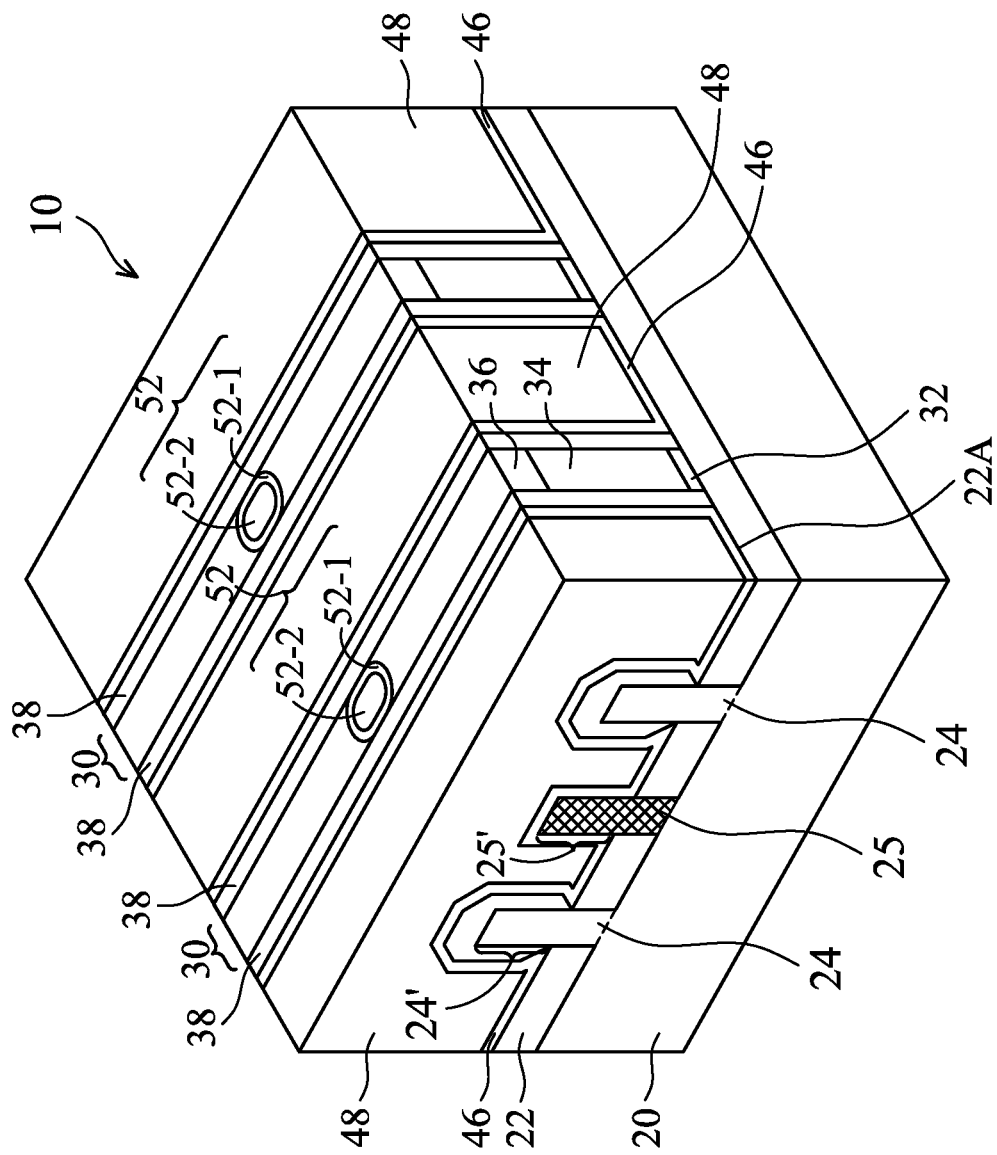
Figure 24:
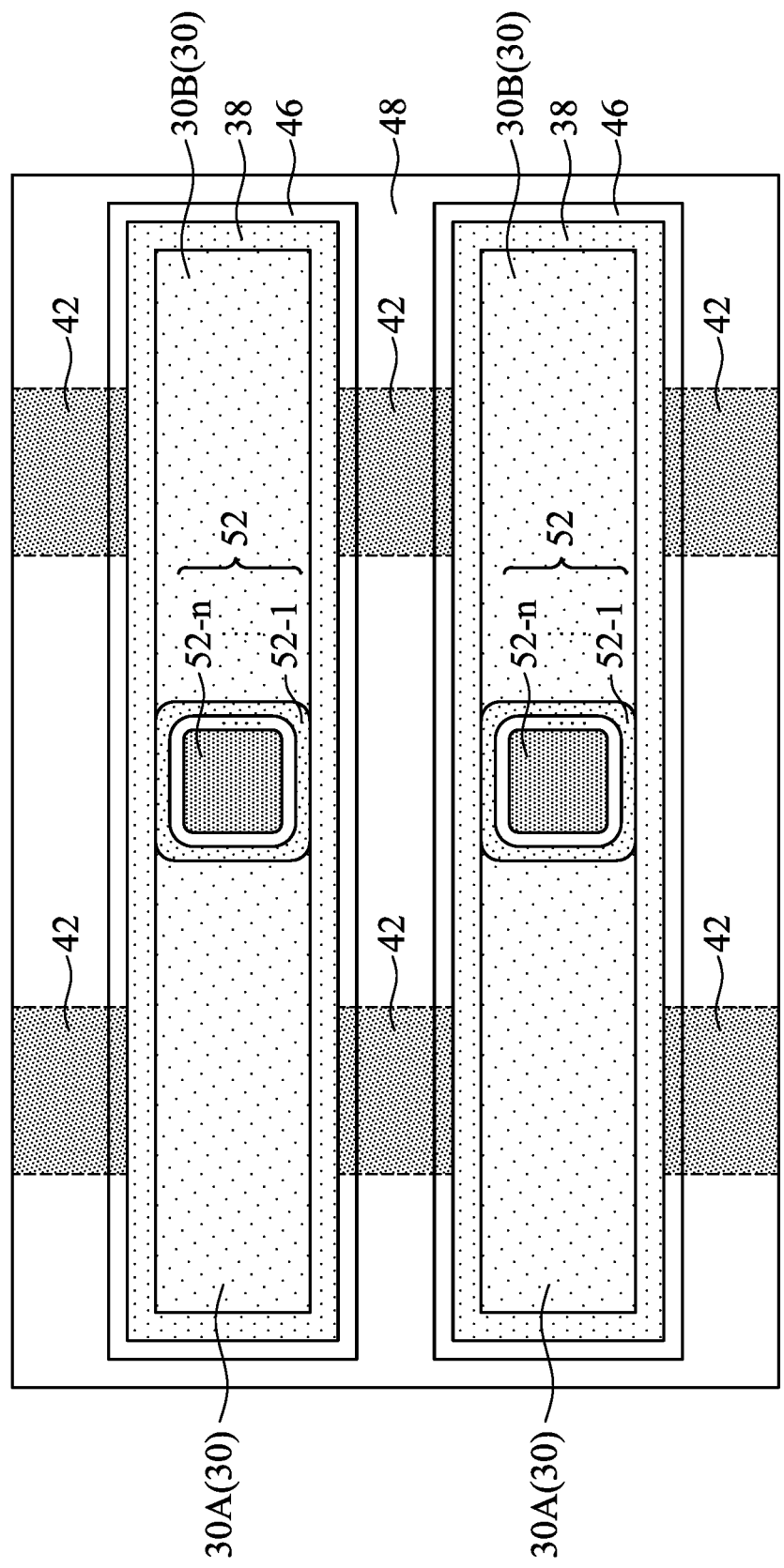
FIGS. 24 and 25 illustrate the formation of gate isolation regions having multiple layers in accordance with some embodiments.

Next, openings 50 are filled by layers/regions 52-1 and 52-2, which form gate isolation regions 52, as shown in FIG. 8A. The respective process is illustrated as process 218 in the process flow 200 as shown in FIG. 26. Layers/regions 52-1 and 52-2 may be formed of dielectric materials, and hence are referred to as dielectric layers/regions hereinafter, while they may also be formed of non-dielectric materials. Dielectric layers 52-1 and 52-2 are formed of different dielectric materials or the same materials having different properties such as different density values. Dielectric layers 52-1 and 52-2 may be selected from the same group of dielectric materials including, and not limited to, oxide-based dielectric materials, nitride-based dielectric materials, oxynitride-based dielectric materials, oxycarbide-based dielectric materials, carbide-based dielectric materials, etc. For example, dielectric layers 52-1 and 52-2 may be formed of materials selected from SiN, SiON, SiOCN, SiC, SiOC, $SiO_2$, or the like. Dielectric layers 52-1 and 52-2 may also be formed of non-dielectric materials such as SiGe. In accordance with some embodiments, dielectric layer 52-1 is formed of an oxide such as silicon oxide, and dielectric layer 52-2 is formed of a nitride such as silicon nitride. In accordance with alternative embodiments, dielectric layers 52-1 and 52-2 are formed of a same material such as silicon oxide, but have different porosity values and hence different density values. In accordance with some embodiments, dielectric layer 52-1 is denser (with a lower porosity) than dielectric layer 52-2. Also, the dielectric layers 52-1 and 52-2 may be formed of a same material, but formed using different process conditions. For example, dielectric layer 52-1 and dielectric layer 52-2 may be formed using a higher temperature and a lower temperature, respectively. For example, when dielectric layer 52-1 and dielectric layer 52-2 are formed of silicon oxide, the higher temperature may be in the range between about 400° C. and about 600° C., and the lower temperature may be in the range between about 200° C. and about 400° C. Furthermore, the higher temperature may be higher than the lower temperature by a difference greater than about 50° C., and the difference may be in the range between about 50° C. and about 300° C. When other materials other than silicon oxide are used, the higher and the lower temperature range may be different from that of silicon oxide. In accordance with alternative embodiments, as shown in FIG. 24, gate isolation region 52 may include more than two layers such as three, four, five, or the like, which may be up to ten layers. Regardless of whether formed of different materials or the same material, dielectric layers 52-1 and 52-2 may be distinguished from each other, for example, using X-Ray diffraction, Transmission electron microscopy (TEM), or the like.

Figures 1, 8B:
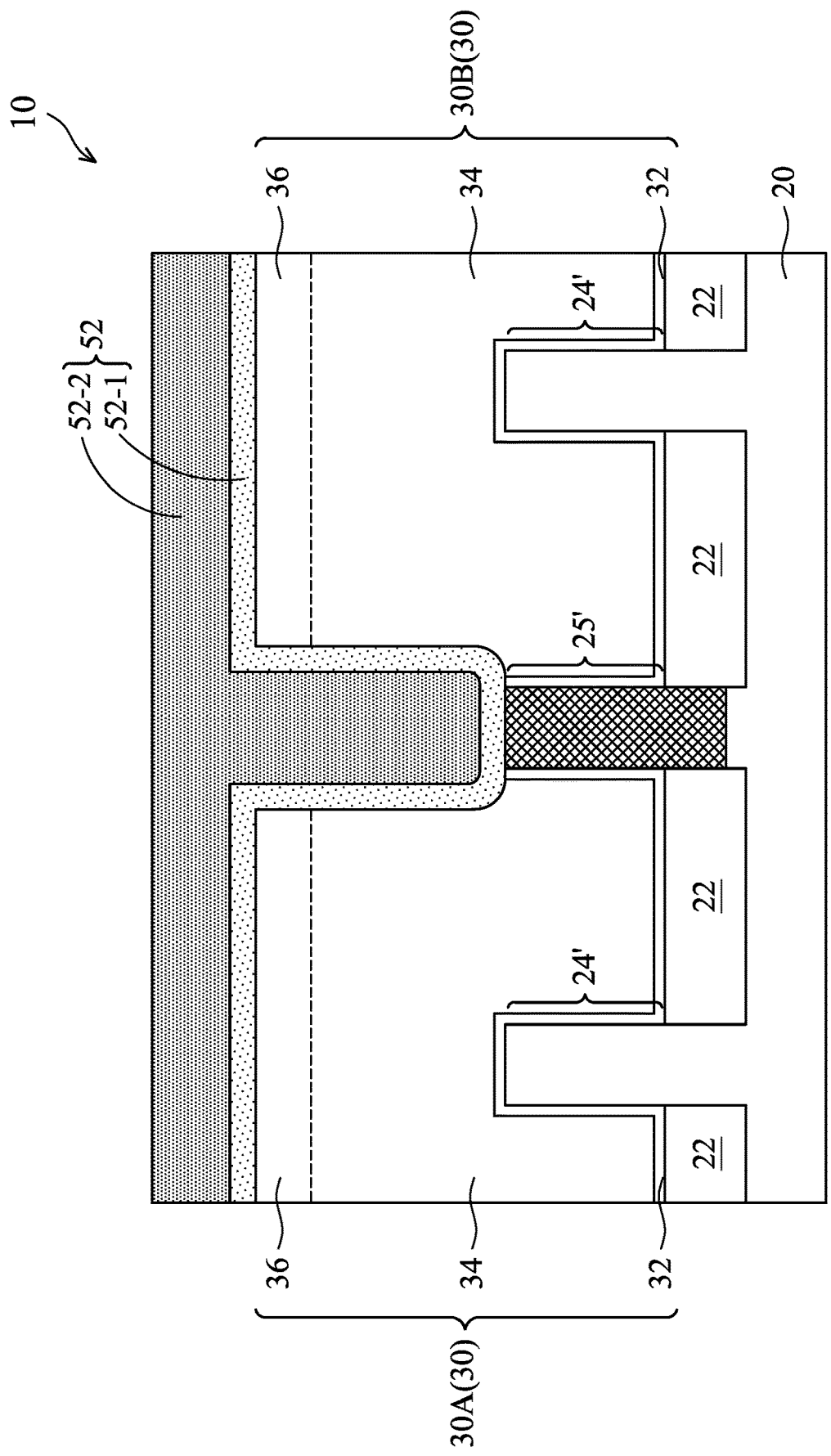
Figures 2, 8B:
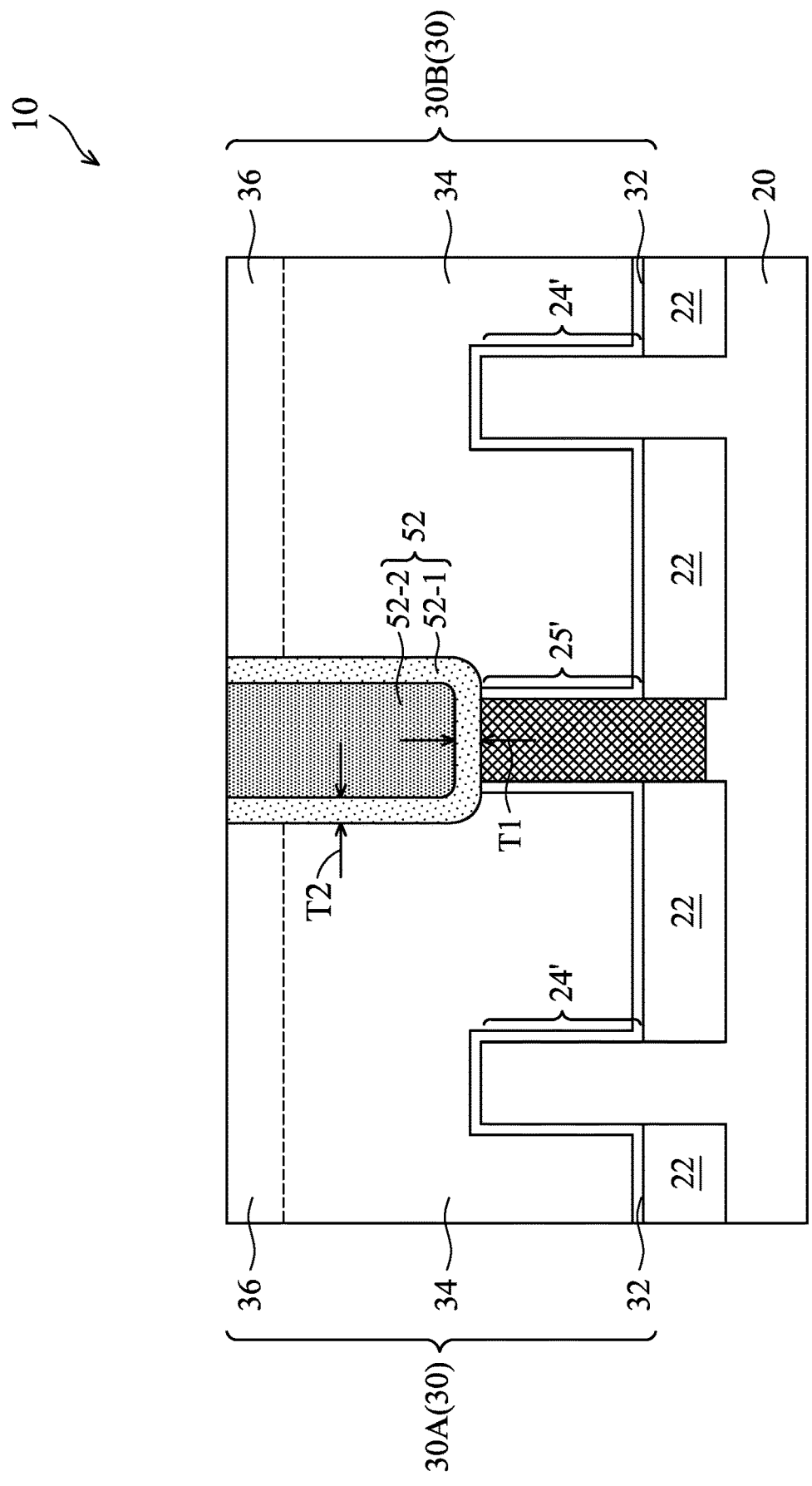

FIGS. 8B-1 and 8B-2 illustrate the processes for forming gate isolation region 52. In accordance with some embodiments, as shown in FIG. 8B-1, dielectric layer 52-1 is formed using a conformal deposition method, and hence the thickness $T_2$ (FIG. 8B-2) of its vertical portions is close to the thickness $T_1$ of its horizontal portions (for example, with a thickness difference smaller than about 20 percent). In accordance with some embodiments, dielectric layer 52-1 is formed using Atomic Layer Deposition (ALD), Plasma Enhanced Atomic Layer Deposition (PEALD), Low-Pressure Chemical Vapor Deposition (LPCVD), Chemical Vapor Deposition (CVD), Plasma enhanced Chemical Vapor Deposition (PECVD), Physical Vapor Deposition (PVD), or other applicable deposition methods. Each of the lower layers (such as 52-1, or 52-2 if more layers are formed) may have a thickness $T_1/T_2$ in the range between about 3 Å and about 500 Å in accordance with some embodiments. Dielectric layer/region 52-2 fills the remaining space of opening 50 (FIG. 7A) unfilled by dielectric layer 52-1. Dielectric layers 52-1 and 52-2 have some portions higher than the top surfaces of dummy gate stacks 30A and 30B.

Figure 8C:
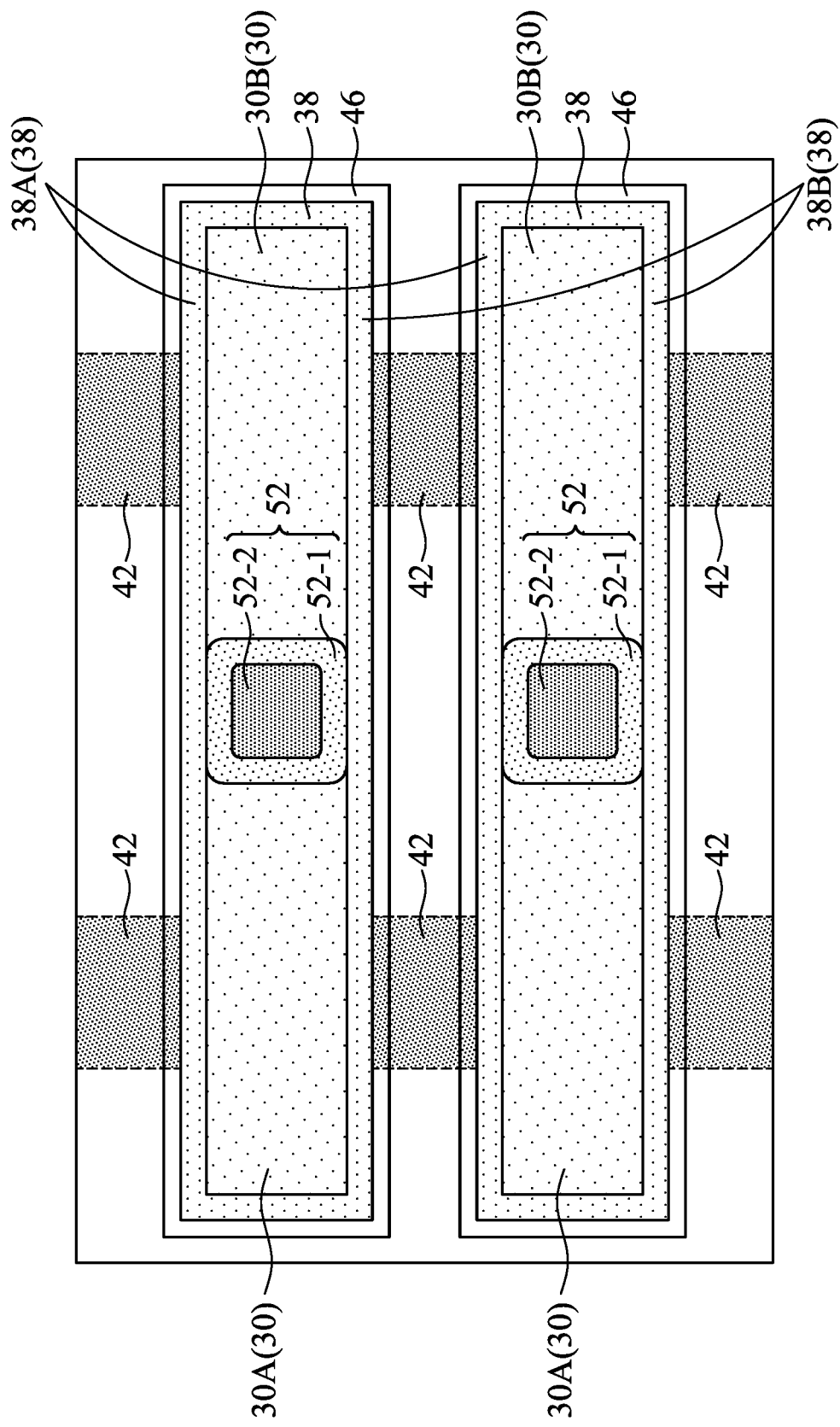

Referring to FIG. 8B-2, a planarization process is performed to remove excess portions of dielectric layers 52-1 and 52-2, leaving gate isolation region 52. The portions of dielectric layers 52-1 and 52-2 higher than the top surfaces of dummy gate stacks 30A and 30B are removed. As a result, dummy gate stacks 30A and 30B are exposed, as shown in FIG. 8C. In the meantime, ILD 48 (FIG. 8A) may also be exposed in accordance with some embodiments. The remaining portions of dielectric layers 52-1 and 52-2 are in combination referred to as gate isolation regions 52 hereinafter, which include the remaining portions of dielectric layers 52-1 and 52-2.

As shown in FIG. 8C, gate isolation regions 52 separate the respective dummy gate stacks 30A and 30B from each other. Gate isolation regions 52 and dummy gate stacks 30A and 30B in combination form elongated strips in the top view, and each of the elongated strips is between opposite portions 38A and 38B of gate spacer 38.

Figure 9A:
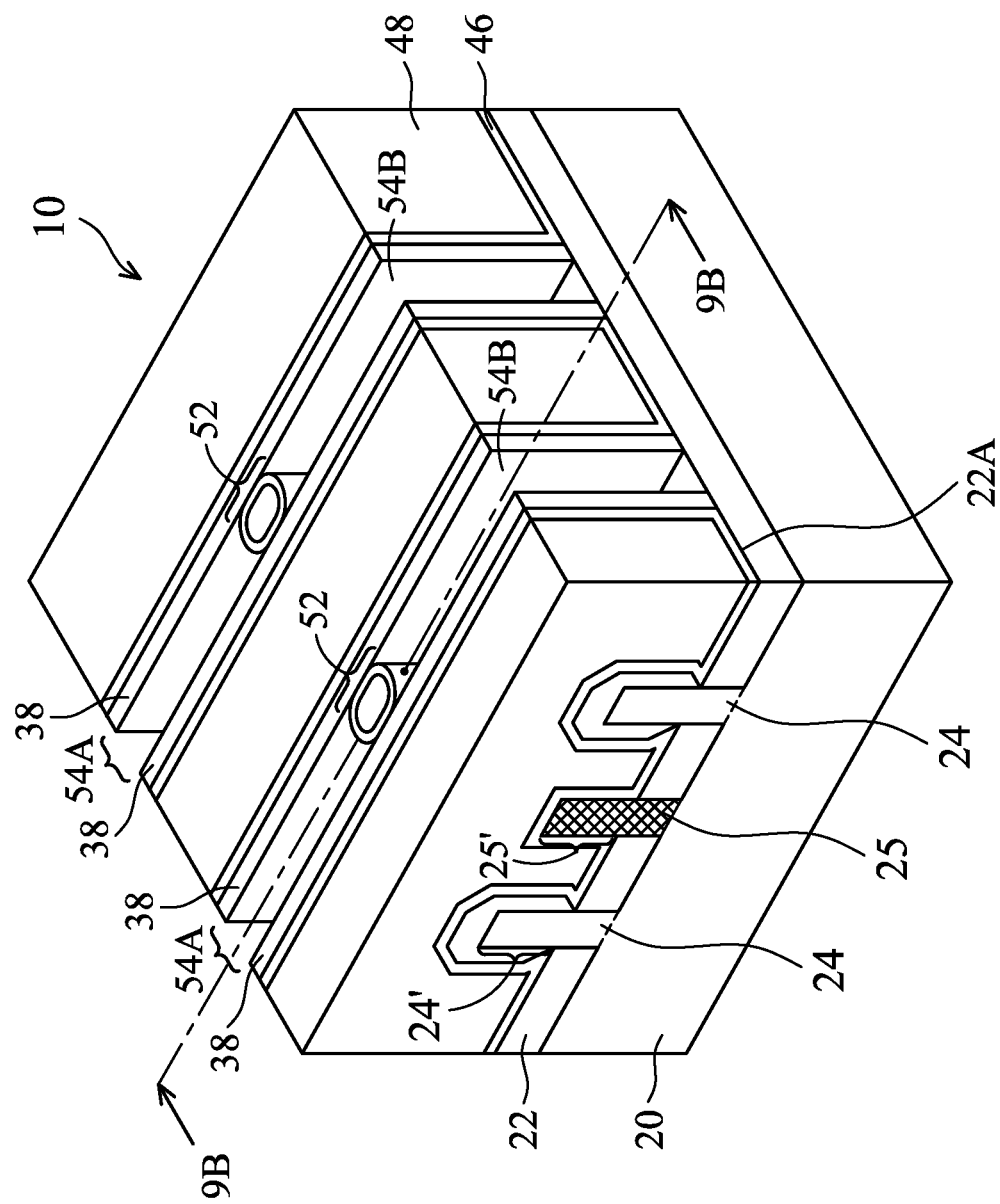
Figure 9B:
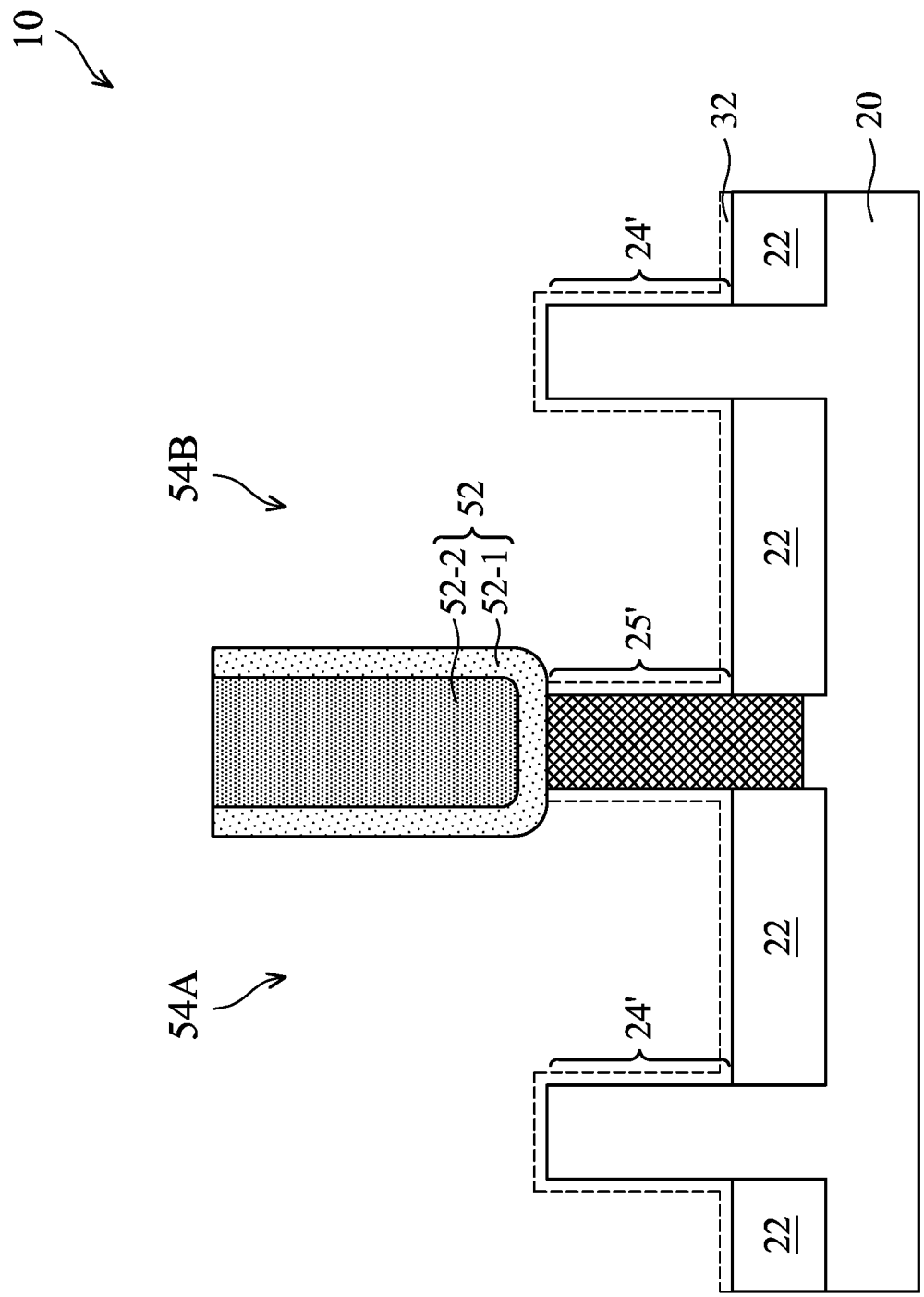

Dummy gate stacks 30A and 30B are then removed through etching, and the resulting structure is shown in FIGS. 9A and 9B. The respective process is illustrated as process 220 in the process flow 200 as shown in FIG. 26. In accordance with some embodiments, dummy gate dielectric 32 is removed. In accordance with alternative embodiments, dummy gate dielectric 32 is not removed during this process, and is exposed after the removal of dummy gate electrodes 34. Accordingly, in FIGS. 9B and 10, dummy gate dielectric 32 is shown as dashed to indicate that it may or may not exist in the respective structure. In these embodiments, dummy gate dielectric 32 may be removed when dielectric layer 52-2 is etched in the process shown in FIGS. 11A and 11B, or may be removed after the process shown in FIGS. 11A and 11B, and before the formation of replacement gates. Openings 54A and 54B are formed in the space left by the removed dummy gate electrodes 34 (and possibly dummy gate dielectrics 32). As shown in FIG. 9A, each of openings 54A and 54B is defined by gate isolation region 52 and gate spacers 38, and openings 54A and 54B are further separated from each other by gate isolation region 52. FIG. 9B illustrates a cross-sectional view obtained from the reference cross-section 9B-9B in FIG. 9A. In accordance with some embodiments of the present disclosure, as shown in FIG. 9B, gate isolation region 52 is wider than the underlying dielectric dummy fin 25'. In accordance with alternative embodiments, gate isolation region 52 may have a same width as, or may be narrower than, dielectric dummy fin 25'.

Figure 10:
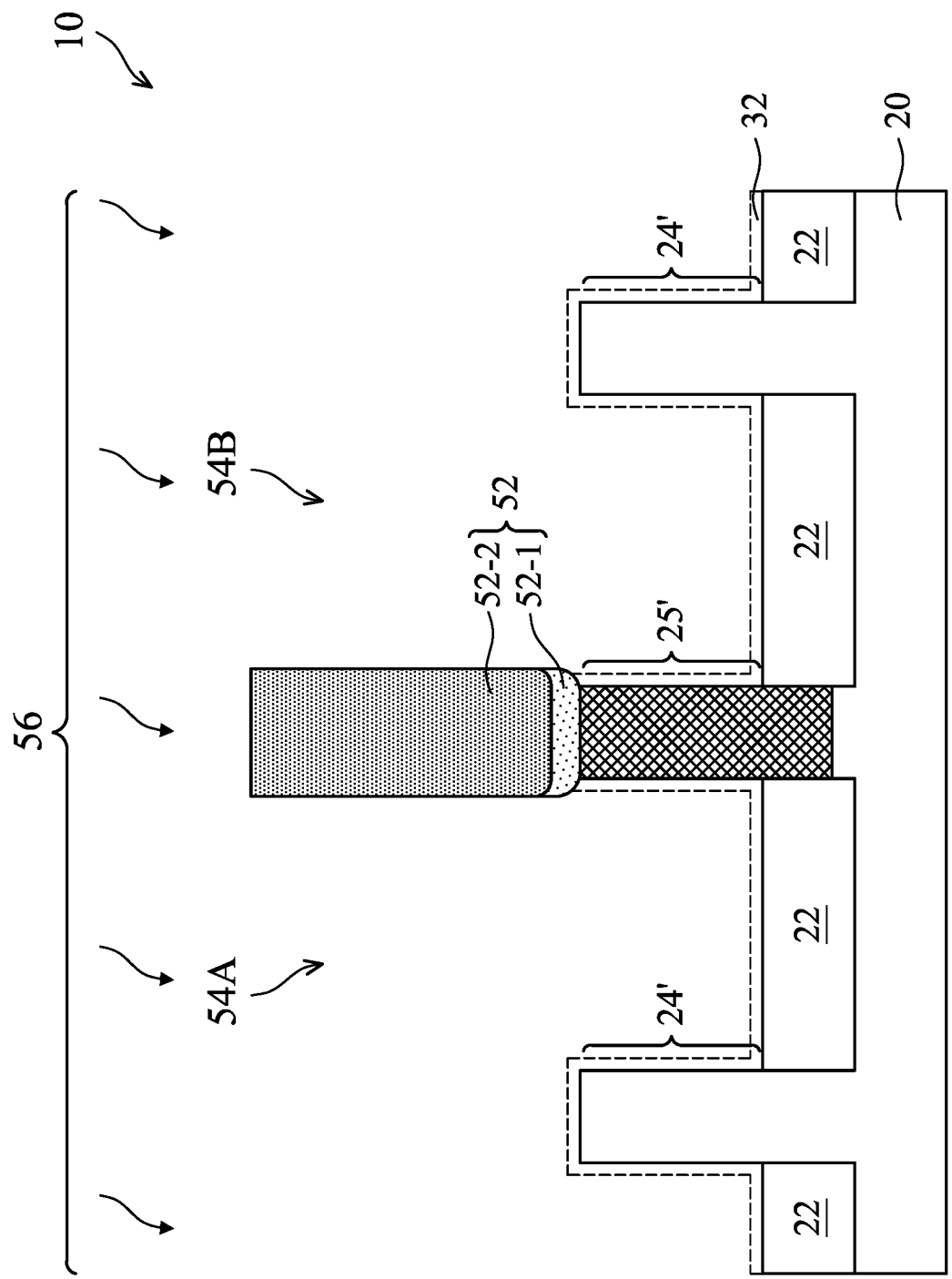

Referring to FIG. 10, a first etching process 56 is performed to remove the outer sidewall portions of dielectric layer 52-1, so that the sidewalls of dielectric layer 52-2 are exposed. The respective process is illustrated as process 222 in the process flow 200 as shown in FIG. 26. The etching process is isotropic, and may be performed through dry etching or wet etching. The etchant is selected according to the materials of dielectric layers 52-1 and 52-2, so that there is a high etching selectivity $ER_{52-1}/ER_{52-2}$, for example, higher than about 4, wherein etching selectivity $ER_{52-1}/ER_{52-2}$ is the etching rate of dielectric layer 52-1 to the etching rate of dielectric layer 52-2. Accordingly, in the first etching process 56, dielectric layer 52-2 is not etched.

Figure 11A:
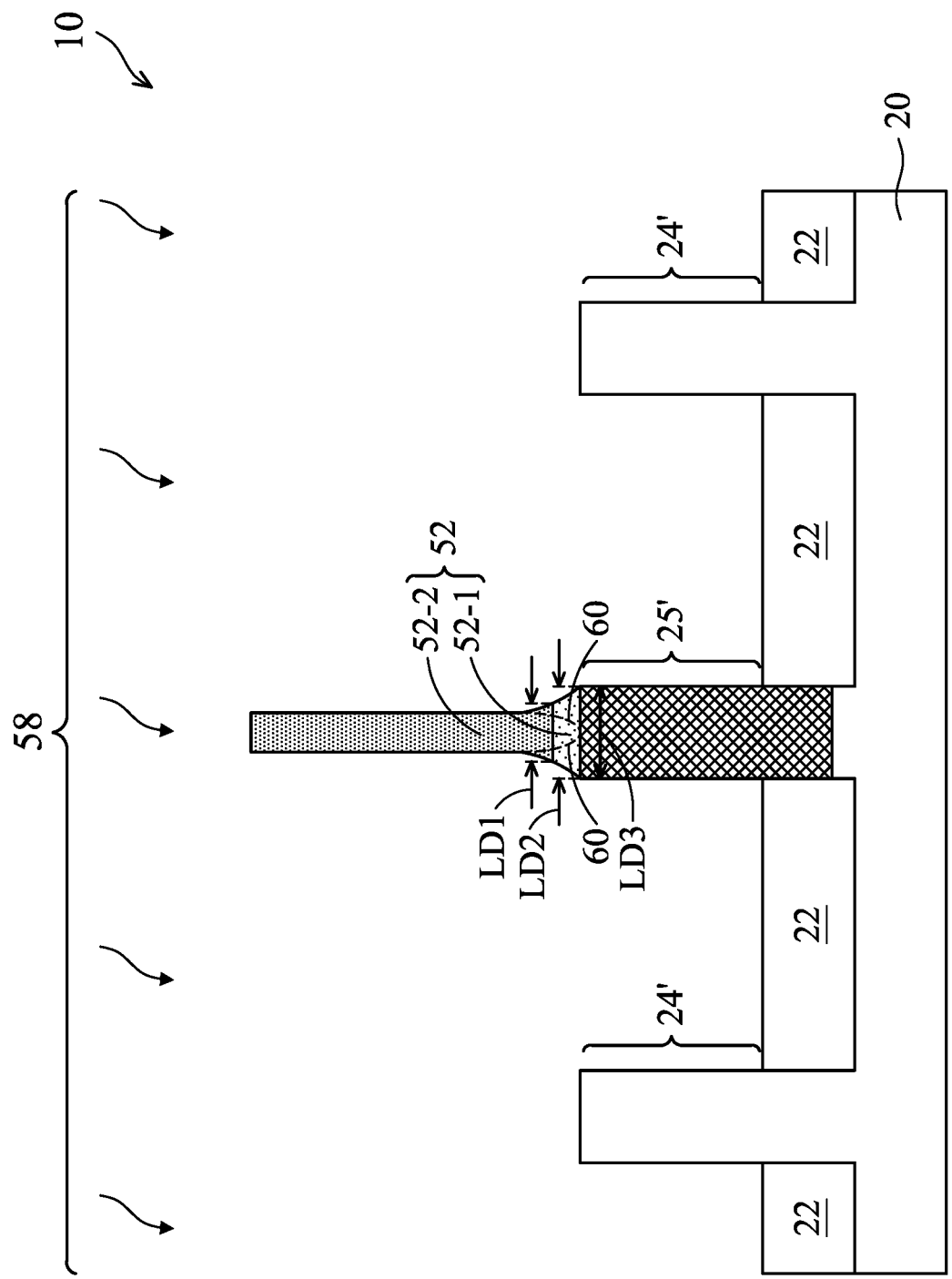
Figure 11B:
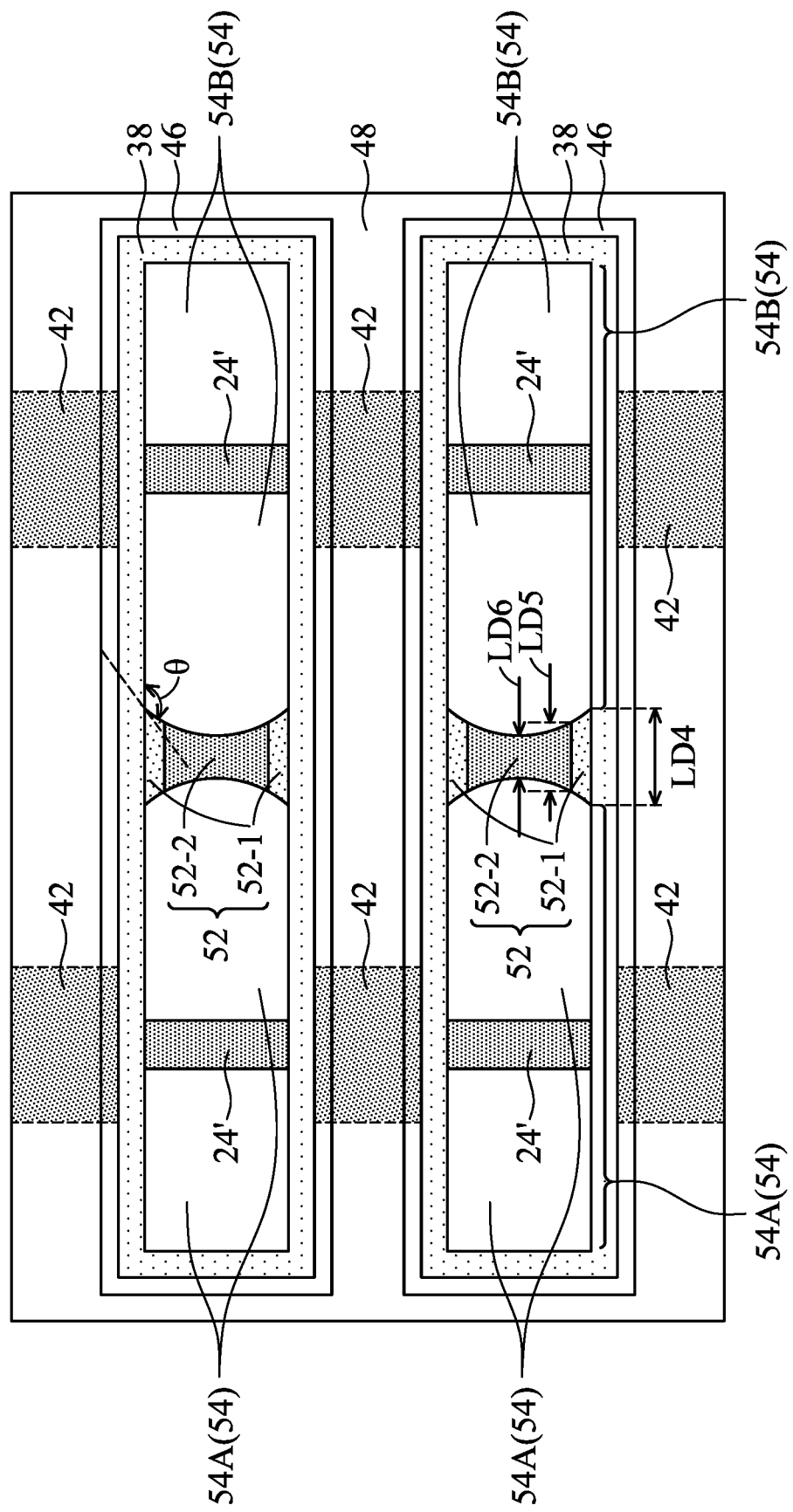

Referring to FIGS. 11A and 11B, a second etching process 58 is performed to thin dielectric layer 52-2, so that the profile of dielectric layer 52-2 is modified. The respective process is illustrated as process 224 in the process flow 200 as shown in FIG. 26. The etching process is isotropic, and may be performed through dry etching or wet etching. The etchant is selected according to the materials of dielectric layers 52-1 and 52-2, so that there is a relatively high etching selectivity $ER_{52-2}/ER_{52-1}$ (the etching rate of dielectric layer 52-2 to the etching rate of dielectric layer 52-1). Accordingly, dielectric layer 52-2 is etched at a higher rate than in the first etching process 56. On the other hand, etching selectivity $ER_{52-2}/ER_{52-1}$ may be kept not too high, so that the corners of dielectric layer 52-1 can still be rounded in the second etching process 58. In accordance with some embodiments, etching selectivity $ER_{52-2}/ER_{52-1}$ is in the range between about 2 and about 20. In accordance with some embodiments of the present disclosure, the dummy gate dielectric 32 (FIG. 10), if not removed in the process shown in FIGS. 9A and 9B, may be removed in the second etching process 58.

In accordance with some embodiments, when one of the etching processes 56 and 58 is performed, depending on the materials of dielectric layers 52-1 and 52-2, the etching gas may be selected from the group consisting of $Cl_2$, HBr, $CF_4$, $CHF_3$, $CH_2F_2$, $CH_3F$, $C_4F_6$, $BCl_3$, $SF_6$, $H_2$, HF, $NH_3$, $NF_3$, and combinations thereof. Also, gases such as $N_2$, $O_2$, $CO_2$, $SO_2$, CO, $SiCl_4$, or combinations thereof may be added to improve the etching selectivity. Inert gases such as Ar, He, Ne, etc., may be added as dilute gases (carrier gas). For example, in an embodiment in which dielectric layer 52-1 is formed of SiN, and dielectric layer 52-2 is formed of $SiO_2$, a fluorine-containing gas such as the mixture of $CF_4$, $O_2$, and $N_2$, the mixture of $NF_3$ and $O_2$, $SF_6$, or the mixture of $SF_6$ and $O_2$, etc. may be used to etch dielectric layer 52-1, while the mixture of $NF_3$ and $NH_3$, the mixture of HF and $NH_3$, or the like may be used to thin dielectric layer 52-2. In the first etching process 56 and the second etching process 58, the plasma source power may be in the range between about 10 watts and about 3,000 watts, the plasma bias power may be lower than about 3,000 watts. The pressure of the etching gas may be in the range between about 1 mTorr and about 800 mTorr. The flow rate of the etching gas may be in the range between about 1 sccm and about 5,000 sccm.

When wet etching is performed in the first etching process 56 and the second etching process 58, still depending on the materials of the dielectric layers 52-1 and 52-2, the respective etching solution for etching the corresponding dielectric layers 52-1 and 52-2 may include HF solution (with fluorine ($F_2$) dissolved therein), $H_2SO_4$, HCl, HBr, $NH_3$, or the like, or combinations thereof. The solvent may include de-ionized water, alcohol, acetone, or the like.

In accordance with alternative embodiments, instead of performing two etching processes using different etching chemicals, a same etching process may be performed to etch both of dielectric layers 52-1 and 52-2. The etchant is selected so that dielectric layer 52-1 has a lower etching rate than dielectric layer 52-2. In the initial stage, the sidewall portions of dielectric layer 52-1 are etched, while dielectric layer 52-2 is protected by the sidewall portions of dielectric layer 52-1. After the sidewall portions of dielectric layer 52-1 are removed, the sidewalls of dielectric layer 52-2 are exposed, and both of dielectric layers 52-1 and 52-2 are etched. Since dielectric layer 52-2 has a higher etching rate than dielectric layer 52-1, it is recessed laterally faster than dielectric layer 52-1, hence forming the profile as shown in FIG. 11B. It is appreciated that in accordance with these embodiments, the etching selectivity $ER_{52-1}/ER_{52-2}$ (the etching rate of dielectric layer 52-1 to the etching rate of dielectric layer 52-2) is smaller than 1.0, and is selected to be in certain range that is not too high and not too low. If the etching selectivity $ER_{52-1}/ER_{52/2}$ is too high, the sidewalls of gate isolation region 52 will be convex (opposite to what is shown in FIG. 11B), not concave. If the etching selectivity $ER_{52-1}/ER_{52-2}$ is too low, there is a risk that dielectric layer 52-2 will be etched-through or even fully removed. In accordance with some embodiments, the etching selectivity $ER_{52-1}/ER_{52-2}$ is in the range between about 0.05 and about 1.

Dielectric layers 52-1 and 52-2 may also be formed of a same material with different properties. For example, both of dielectric layers 52-1 and 52-2 may be formed of silicon oxide, with dielectric layer 52-2 being more porous than dielectric layer 52-1. Accordingly, instead of performing two etching processes using different etching chemicals, a same etching process may be performed to etch both of dielectric layers 52-1 and 52-2. In the beginning of the etching process, the sidewall portions of dielectric layer 52-1 are etched, while dielectric layer 52-2 is protected by the sidewall portions of dielectric layer 52-1. After the sidewall portions of dielectric layer 52-1 are removed, the sidewalls of dielectric layer 52-2 are exposed, and both of dielectric layers 52-1 and 52-2 are etched. Since dielectric layer 52-2 has a lower density than dielectric layer 52-1, dielectric layer 52-2 has a higher etching rate than dielectric layer 52-1. As a result, the resulting gate isolation region 52 also has the profile as shown in FIGS. 11A and 11B.

Through the etching of dielectric layers 52-1 and 52-2 as aforementioned, the profiles as shown in FIGS. 11A and 11B may be formed. As shown in FIG. 11A, the bottom width of dielectric layer 52-2, the bottom width of dielectric layers 52-1, and the top width of dielectric dummy fin 25' are denoted as LD1, LD2, and LD3, respectively. In accordance with some embodiments, bottom width LD1 is smaller than bottom width LD2. Bottom width LD2 may be equal to or smaller than top width LD3. The bottom portions of the sidewalls of gate isolation region 52 may have a concave shape. Furthermore, the bottom portions of the sidewalls of gate isolation region 52 are curved and smooth. This smooth and concave profile makes the subsequent formation of replacement gates easy since there is no undercut that is difficult to fill. For example, dashed lines 60 are drawn to illustrate the curved bottom of a gate isolation region formed using conventional method, in which gate isolation region would be formed of a homogenous material. The dashed lines 60 illustrate that sharp undercuts will be formed directly under the edge portions of the gate isolation region, which undercuts are very difficult to be filled by replacement gate.

FIG. 11B illustrates a top view of the structure shown in FIG. 11A. Gate isolation regions 52, due to the etching process as aforementioned, have concave sidewalls. For example, the middle part of gate isolation region 52 may be the narrowest, while the edge portion of gate isolation region 52 contacting gate spacers 38 may be the widest. In FIG. 11B, width (lateral dimension) LD4 is greater than width LD5, and width LD5 is greater than width LD6. In accordance with some embodiments, the width difference (LD4–LD5) may be greater than about 5 Å, and the ratio (LD4–LD5)/LD4 may be greater than about 0.05, and may be in the range between about 0.05 and about 1. Also, the width difference (LD5–LD6) may be greater than about 5 Å, and the ratio (LD5–LD6)/LD5 may be greater than about 0.05, and may be in the range between about 0.05 and about 1.

Also, the angle θ formed between the sidewalls of gate isolation region 52 and the sidewalls of the corresponding parts of gate spacers 38 is equal to or greater than 90 degrees, and may be in the range between 90 degrees and about 160 degrees. This right or obtuse angle also makes it easy for the filling of replacement gates in the subsequent processes.

Figure 12A:
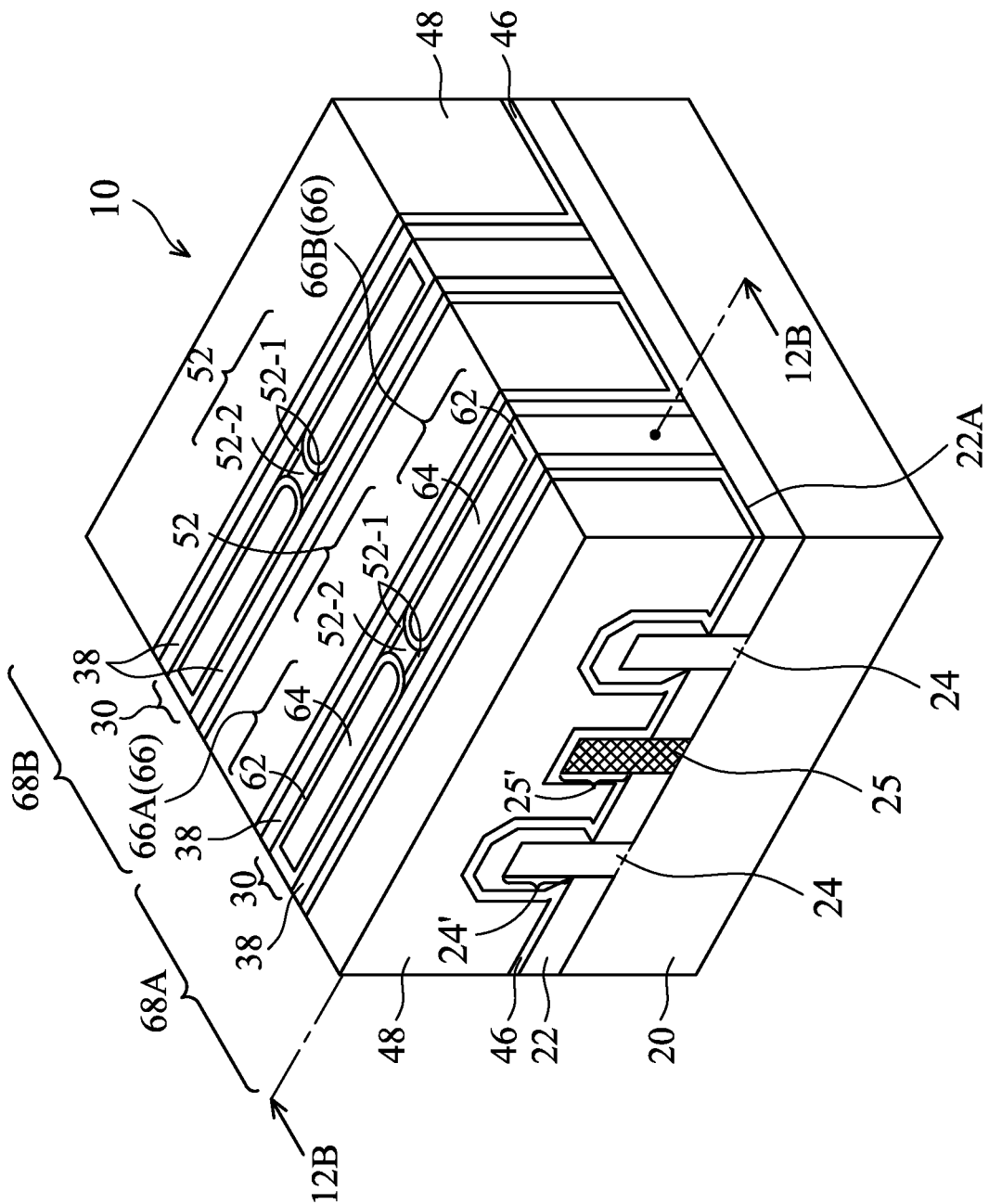
Figure 12B:
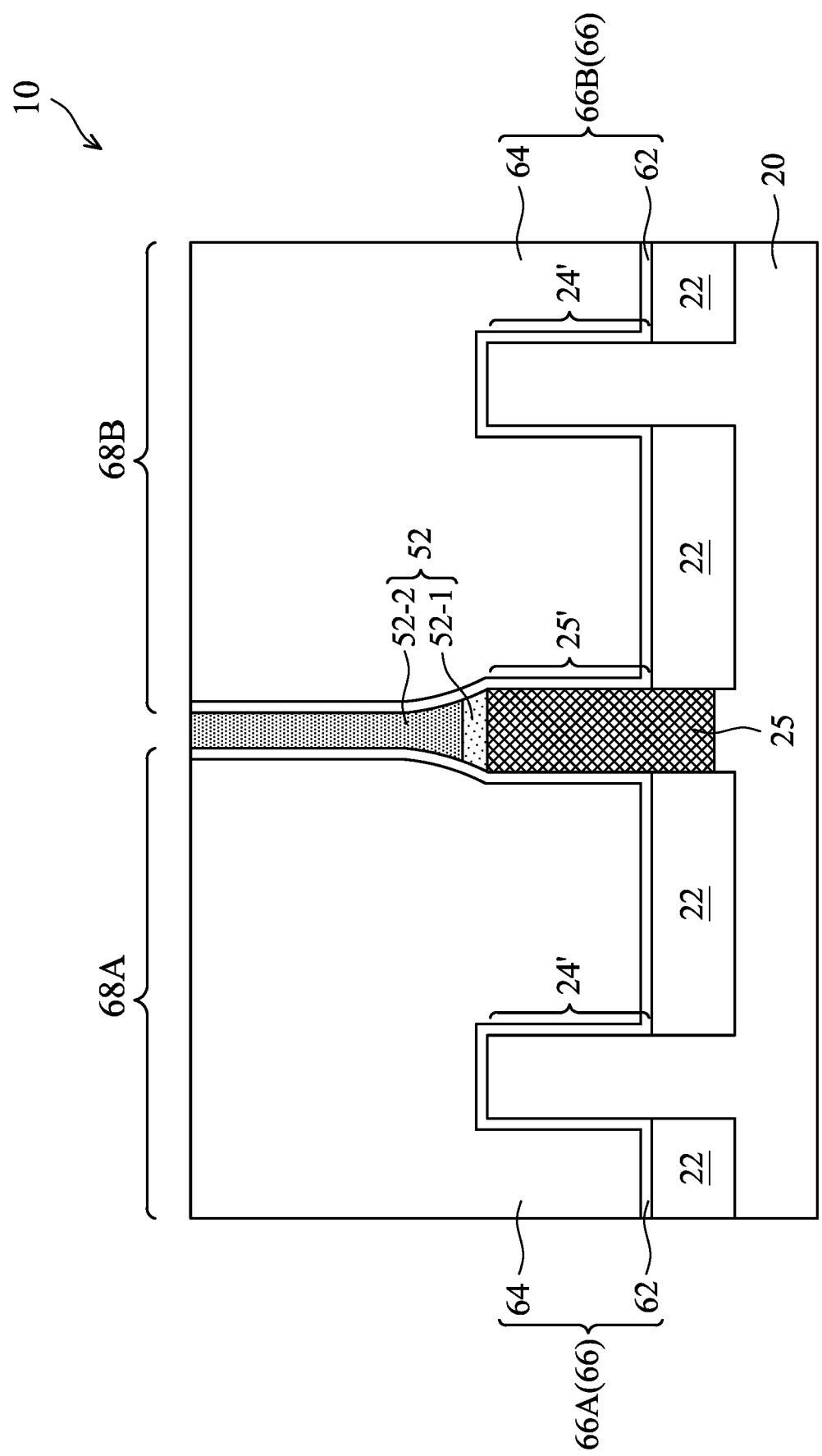
Figure 12C:
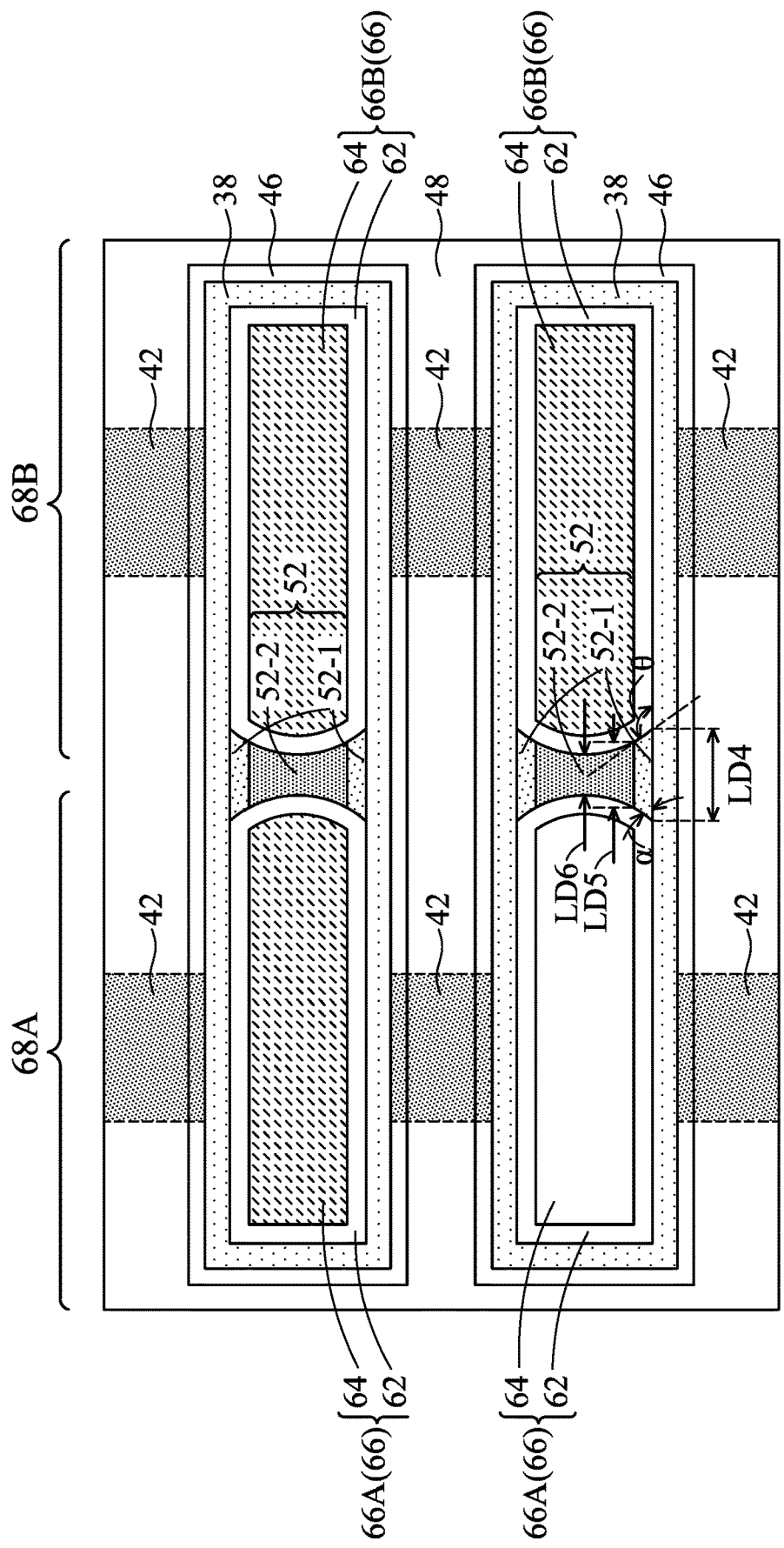

FIGS. 12A, 12B, and 12C illustrate a perspective view, a cross-sectional view, and a top view, respectively, in the formation of replacement gate stacks 66A and 66B. The respective process is illustrated as process 226 in the process flow 200 as shown in FIG. 26. FinFETs 68A and 68B are thus formed, with gate stacks 66A and 66B being the replacement gate stacks of FinFETs 68A and 68B, respectively. Replacement gate stacks 66A and 66B share common gate spacers 38A and 38B. Furthermore, both of replacement gate stacks 66A and 66B abut the gate isolation region 52.

Replacement gate stacks 66A and 66B include gate dielectrics 62 and gate electrodes 64. Gate dielectrics 62 may include a high-k dielectric material such as hafnium oxide, zirconium oxide, lanthanum oxide, or the like, and may also include a silicon oxide layer as an interfacial layer between the high-k dielectric material and protruding fins 24'. In accordance with some embodiments of the present disclosure, gate electrodes 64 are formed of a metal, a metal alloy, a metal silicide, a metal nitride, or the like, and may have a composite structure including a plurality of layers formed of TiN, TiAl, Co, Al, and/or the like. The respective metals and the structure are selected so that the resulting replacement gate electrodes 64 have appropriate work functions. For example, when the resulting FinFET is an n-type FinFET, the work function of gate electrode is lower than 4.5 eV, and when the resulting FinFET is a p-type FinFET, the work function of gate electrode is higher than 4.5 eV.

FIG. 12B illustrates a cross-sectional view obtained from the reference cross-section 12B-12B in FIG. 12A. As shown in FIG. 12B, gate dielectrics 62 are in contact with both of dielectric layers 52-1 and 52-2 of gate isolation region 52. FIG. 12C illustrates a top view of the structure shown in FIG. 12A. FIG. 12C illustrates angle θ and its complementary angle α. Angle α may be equal to or greater than 90 degrees, and may in the range between 90 degrees and about 160 degrees. Since the portions of replacement gates stacks 66 contacting gate isolation region 52 have convex shapes, it is easy to fill replacement gate stacks 66 therein without leaving voids.

FIGS. 13, 14A, 14B, and 15-19 illustrate the cross-sectional views and the perspective views of intermediate stages in the formation of FinFETs and a gate isolation region in accordance with some embodiments. These embodiments are similar to the embodiments disclosed in the preceding embodiments, except that gate isolation region 52, instead of landing on dielectric dummy fin 25', lands on STI region 22. Unless specified otherwise, the materials and the formation processes of the components in these embodiments (and the embodiments shown in FIGS. 20-25) are essentially the same as the like components, which are denoted by like reference numerals in the preceding embodiments shown in preceding figures. The details regarding the formation process and the materials of the components shown in FIGS. 13, 14A, 14B, and 15-19 may thus be found in the discussion of the preceding embodiments.

Figure 13:
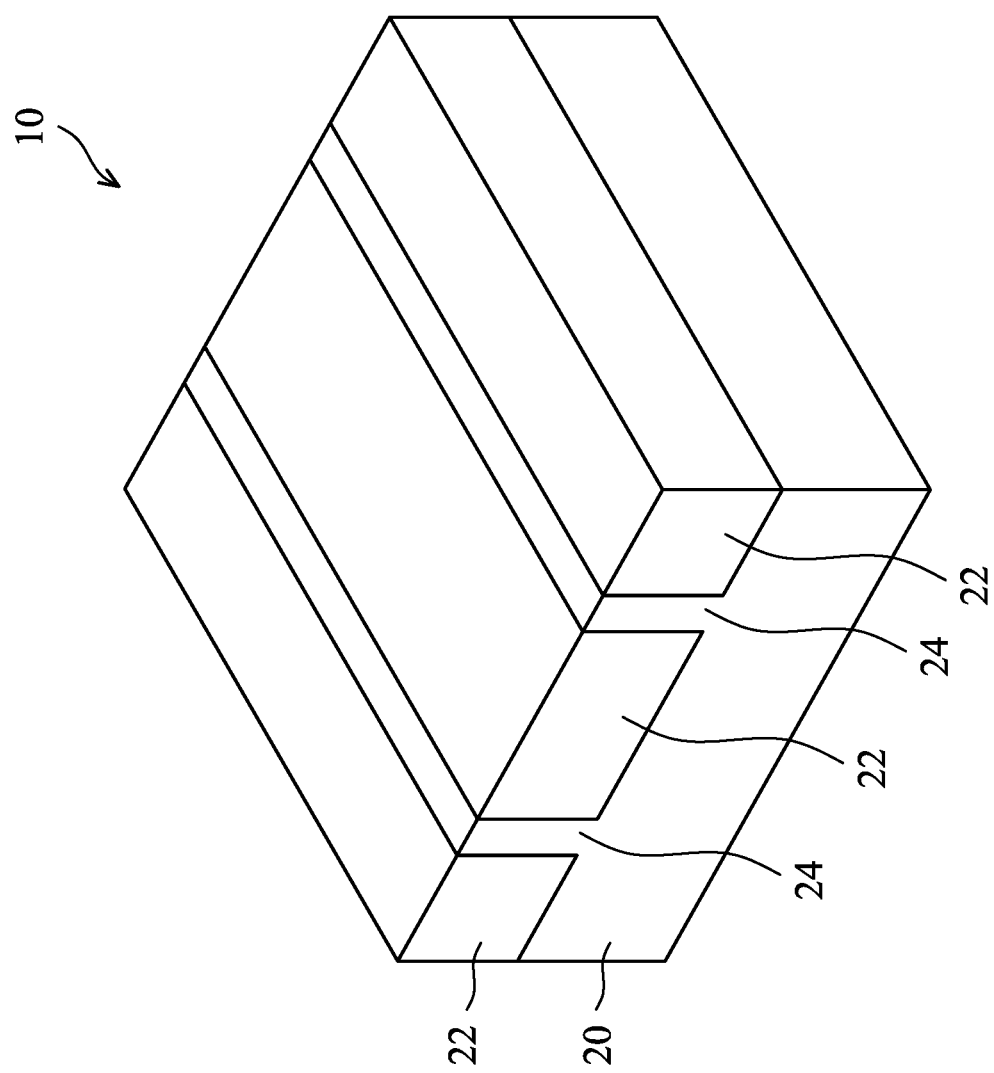
FIGS. 13, 14A, 14B, and 15-19 illustrate the cross-sectional views and the perspective views of intermediate stages in the formation of Fin Field-Effect Transistors (FinFETs) and a gate isolation region on a shallow trench isolation region in accordance with some embodiments.

FIG. 13 illustrates a first semiconductor strip 24 and a second semiconductor strip 24, with a continuous STI region 22 extending from the first semiconductor strip 24 to the second semiconductor strip 24. Next, the processes as shown in FIGS. 3-6 and 7A are performed. The process shown in FIG. 2 is skipped, and hence no dielectric dummy fin is formed.

Figure 14A:
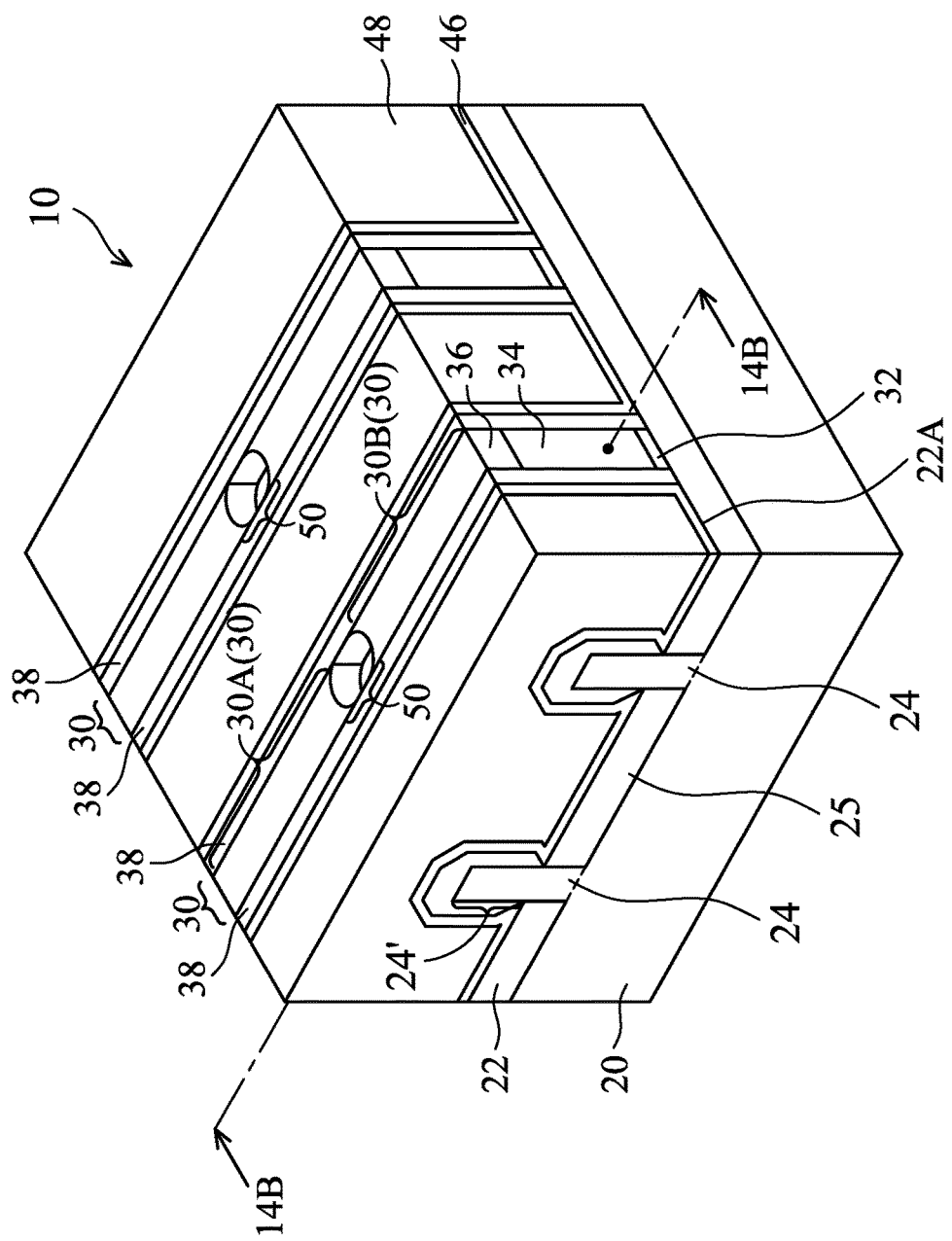
Figure 14B:
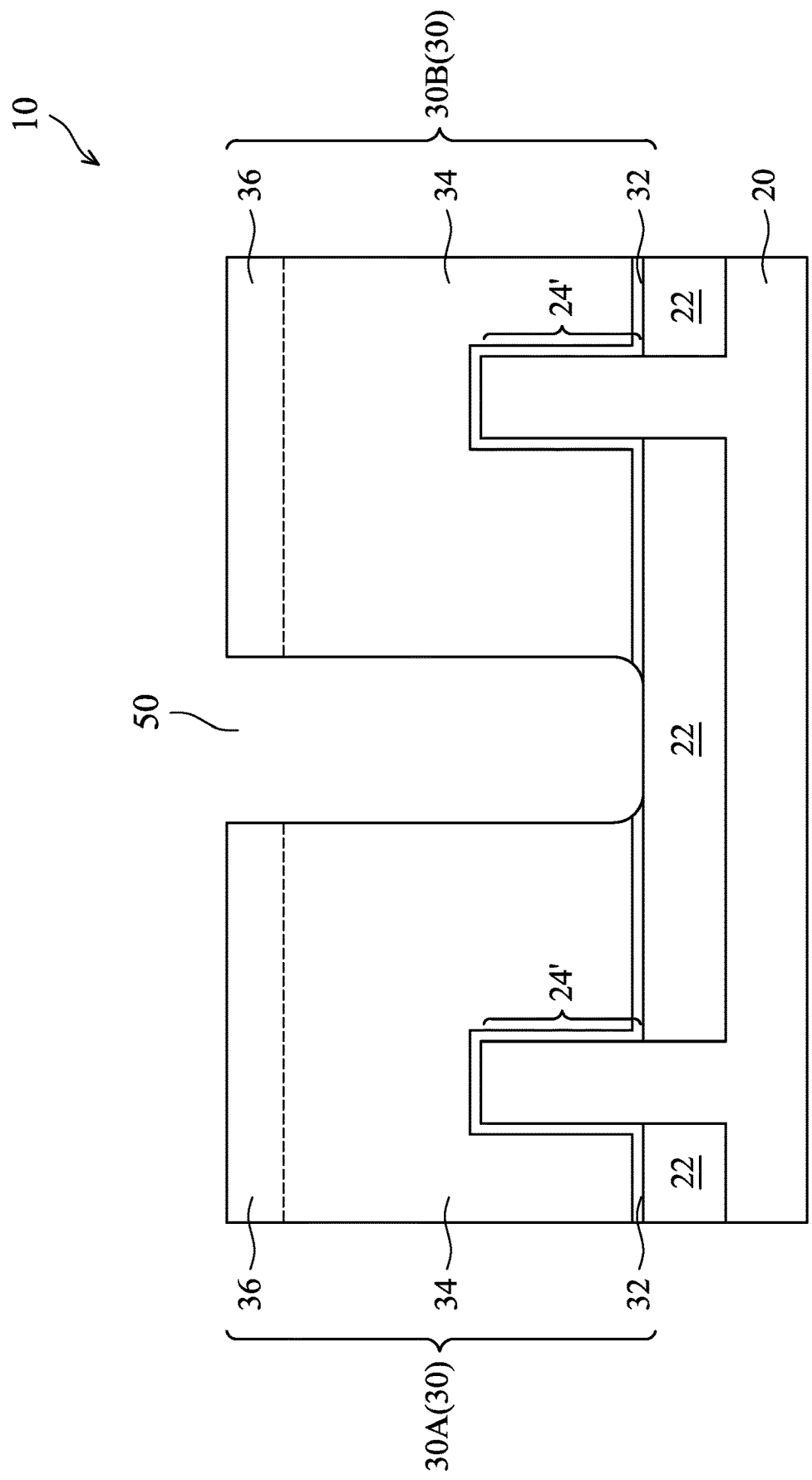

FIG. 14A illustrates a structure after the formation of CESL 46 and ILD 48. Furthermore, openings 50 are formed to cut dummy gate stacks 30 into shorter portions 30A and 30B. FIG. 14B illustrates a cross-sectional view obtained from the reference cross-section 14B-14B in FIG. 14A. Opening 50 extends all the way to STI region 22, so that dummy gate stack 30A is physically and electrically separated from dummy gate stacks 30B. The top-view shapes of the structure shown in FIGS. 14A and 14B are essentially the same as what is shown in FIG. 7C, except that no dielectric dummy fins 25' are formed, and STI region 22 will be exposed to openings 50.

Figure 15:
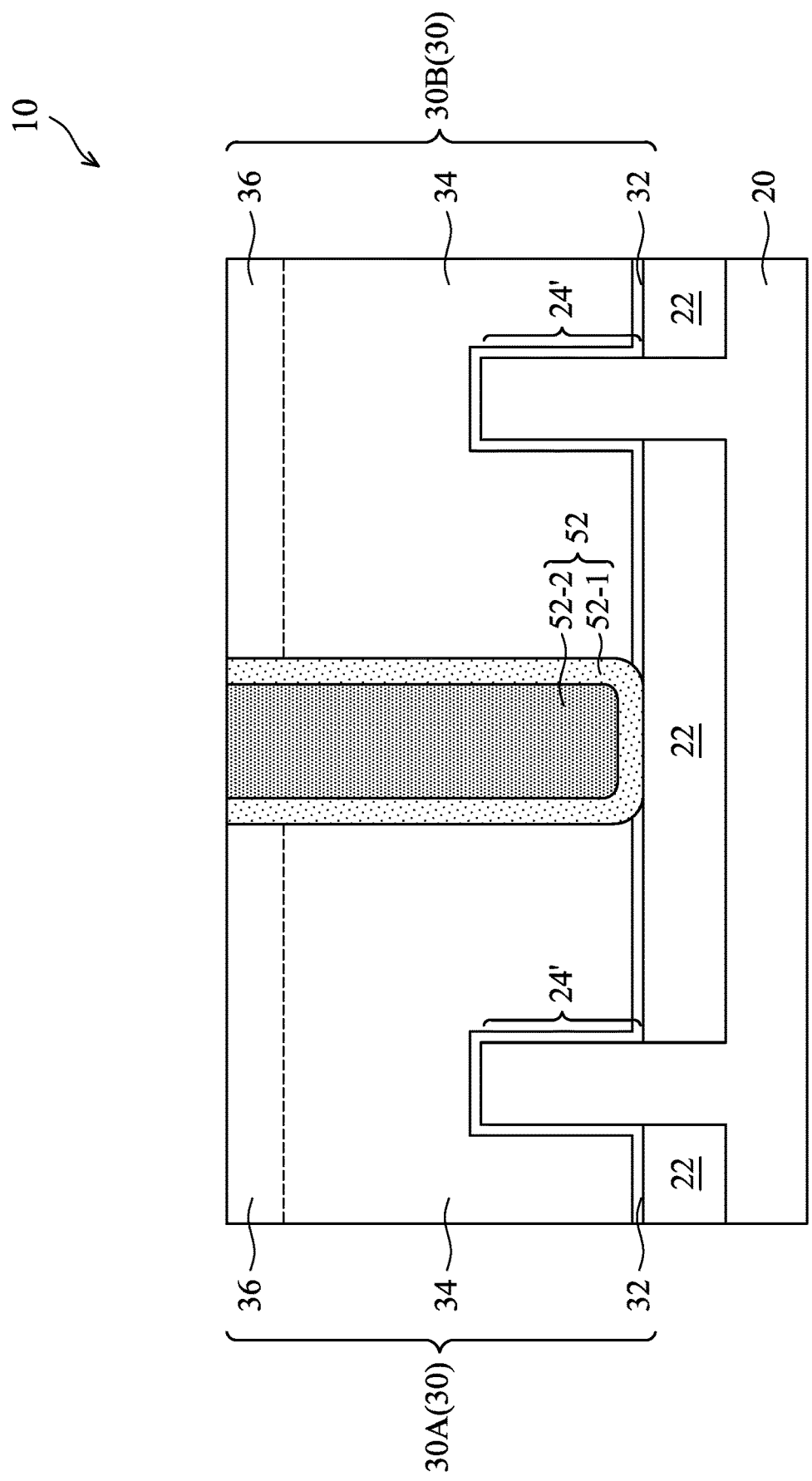
Figure 16:
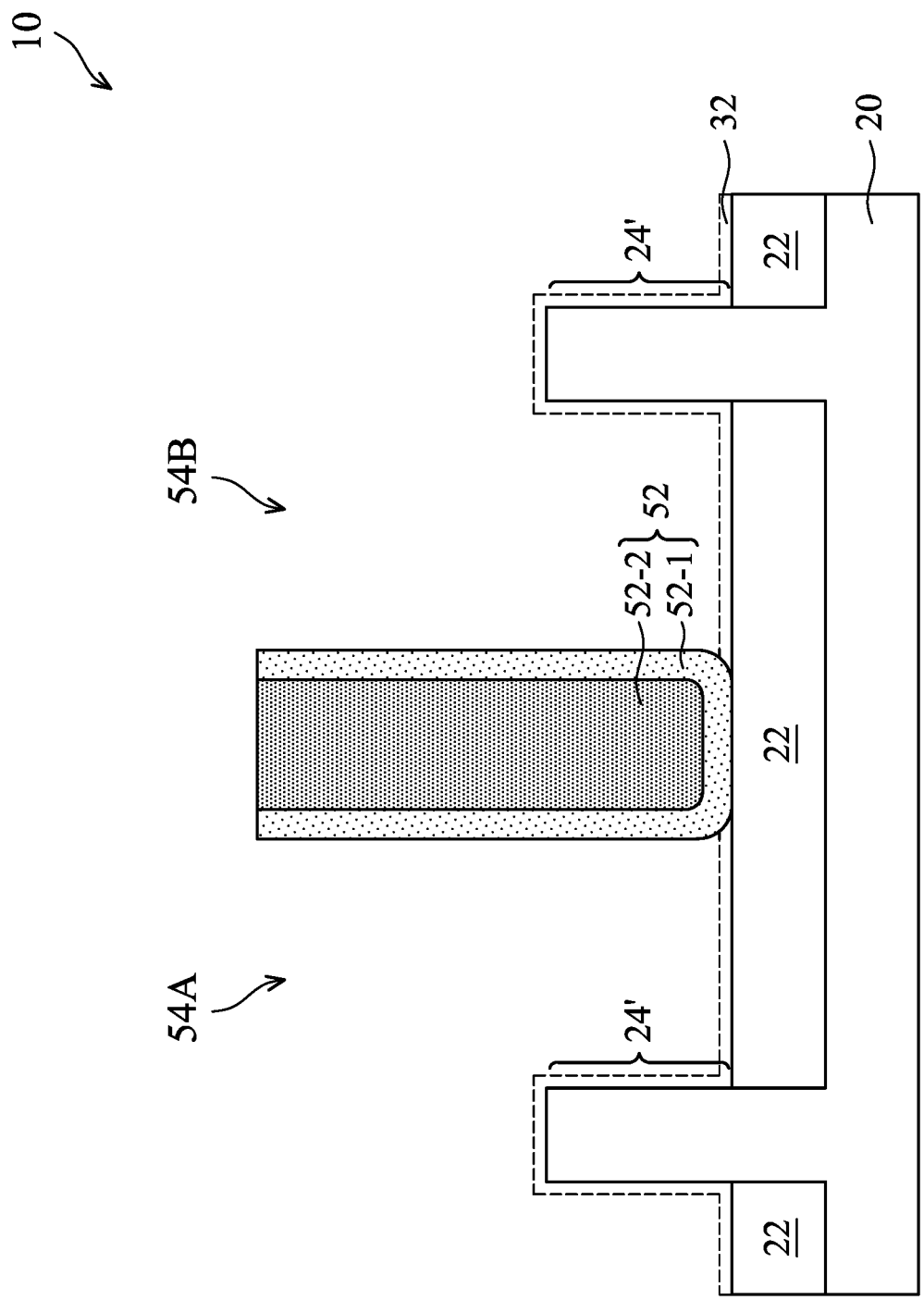

Next, as shown in FIG. 15, gate isolation region 52 is formed in opening 50. The formation details and materials may be found referring to the discussion of FIGS. 8B-1 and 8B-2. Next, the dummy gate stacks 30A and 30B are removed to reveal either dummy gate dielectric 32 or protruding fins 24', depending on whether dummy gate dielectric 32 is removed or not at this time. The resulting structure is shown in FIG. 16.

Figure 17:
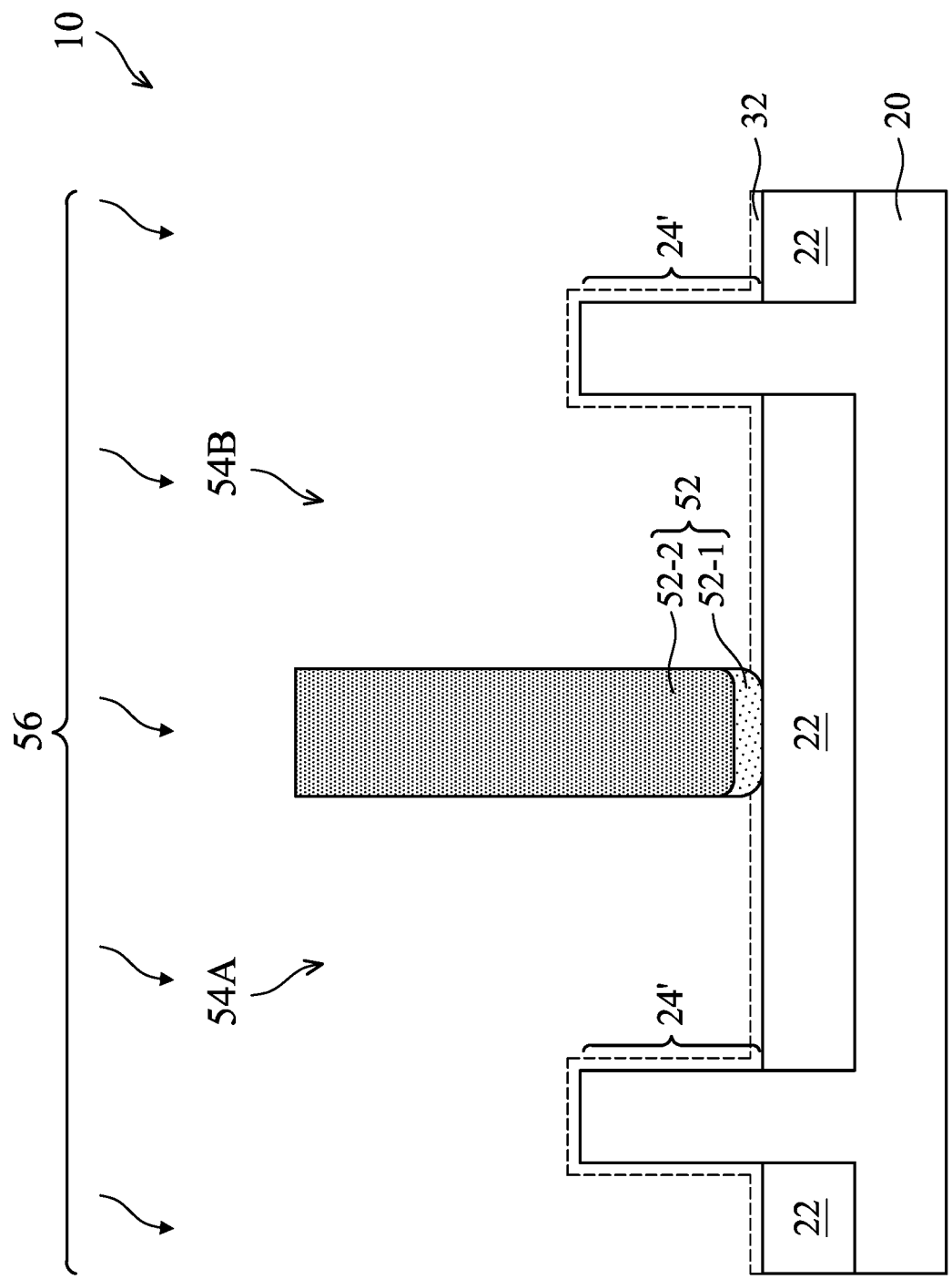
Figure 18:
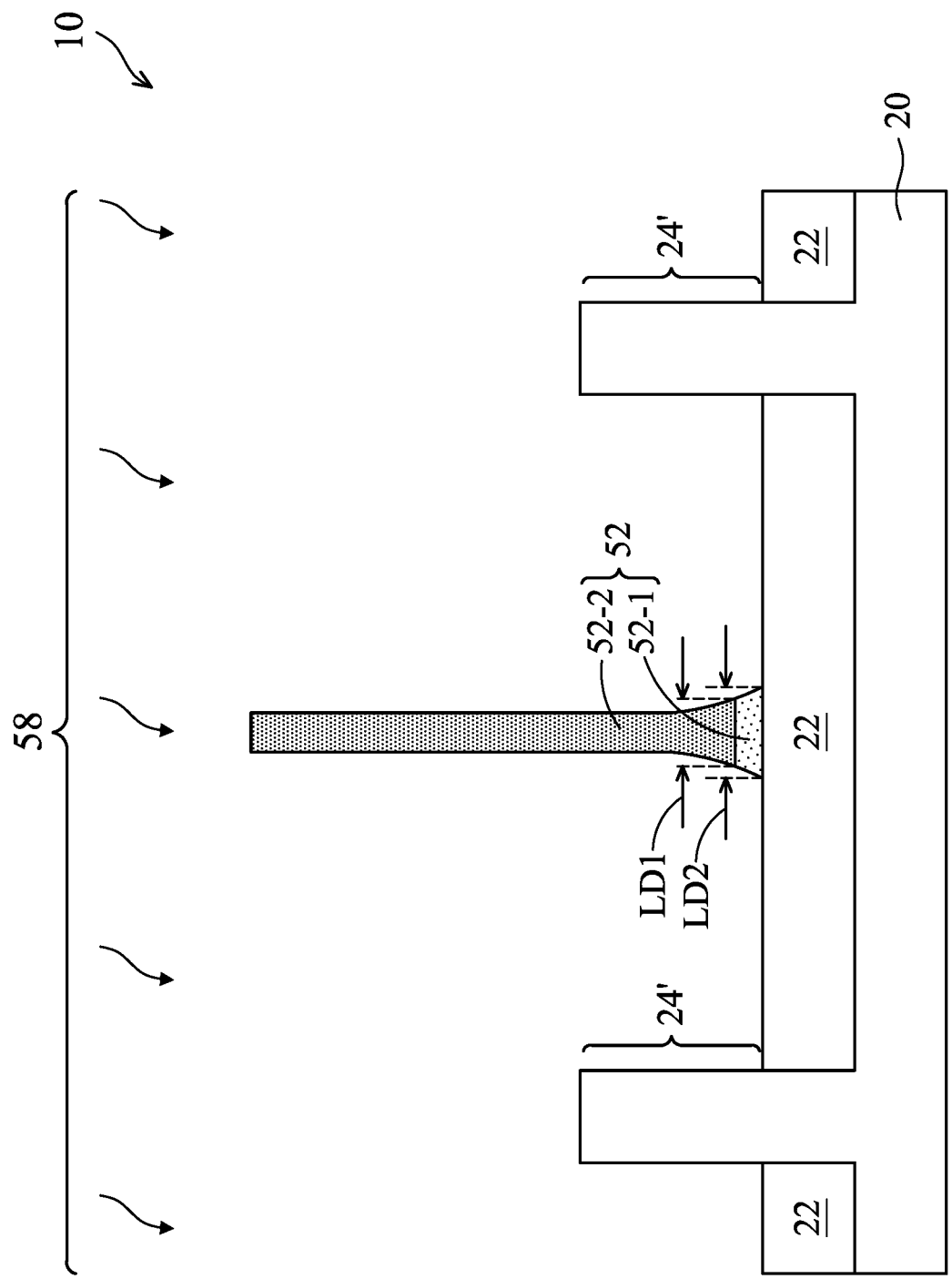
Figure 19:
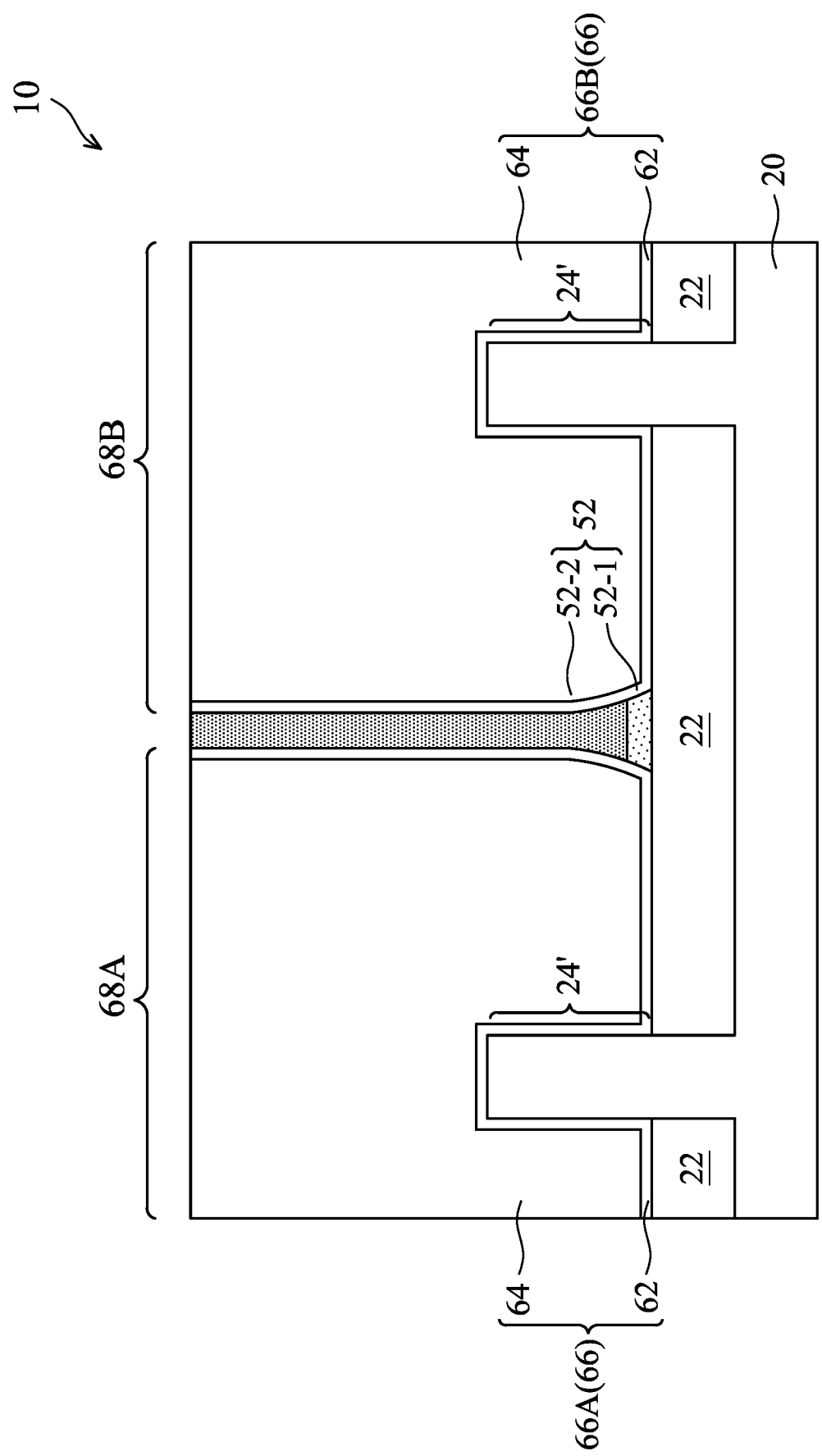

FIG. 17 illustrates the first etching process 56, in which the sidewall portions of dielectric layer 52-1 are removed, and the sidewalls of dielectric layer 52-2 are exposed to openings 54A and 54B. FIG. 18 illustrates the second etching process 58, so that the profile as shown in FIG. 18 is formed. The values of widths LD1, LD2, and LD3 and the relationship (such as the ratios) between widths LD1, LD2, and LD3 may be similar to what have been discussed referring to FIG. 11A, and are not repeated herein. The top-view shape of gate isolation region 52 may be essentially the same as shown in FIG. 11B. FIG. 19 illustrates the formation of replacement gate stacks 66A and 66B. FinFETs 68A and 68B are thus formed.

The processes for forming gate isolation regions may also be applied to the formation of other types of transistors other than FinFETs. For example, the processes may be applied on the dummy gate cutting for planar transistors, Gate-All-Around (GAA) transistors, or the like. FIGS. 20 through 23 illustrate the example embodiments in which gate isolation regions are formed for GAA transistors.

Figure 20:
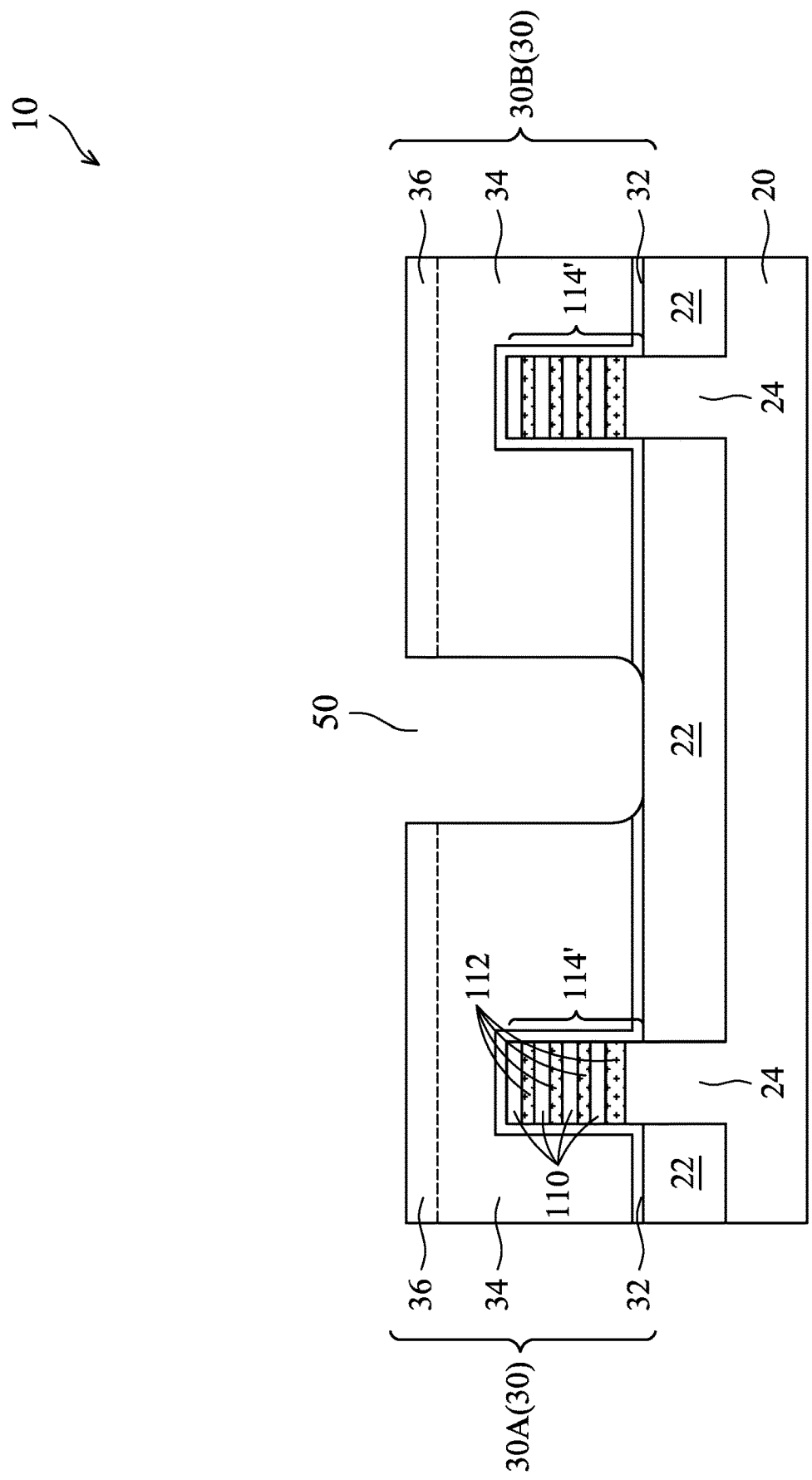
FIGS. 20 through 23 illustrate the cross-sectional views in the formation of Gate-All-Around (GAA) Transistors and gate isolation regions in accordance with some embodiments.

Referring to FIG. 20, two stacked layers 114 and 114' are formed. Each of stacked layers 114 and 114' includes channel layers 110 and sacrificial films 112. The total number of channel layers 110 and the total number of sacrificial films 112 may be in the range between, and including, 1 and about 10. The material of channel layers 110 and sacrificial films 112 are different from each other. In accordance with some embodiments, the channel layers 110 are formed of or comprise Si, SiGe, or the like. The sacrificial films 112 may be formed of or comprise SiGe, SiP, SiOCN, SiC, or the like. Stacked layers 114 and 114' overlap the respective semiconductor strips 24. Dummy gate stacks 30, which include dummy gate dielectric 32, dummy gate electrodes 34, and hard masks 36, are formed on the stacked layers 114 and 114'. Opening 50 is formed by etching dummy gate stack 30.

In accordance with some embodiments, the perspective view shape and the top-view shape of the structure shown in FIG. 20 are essentially the same as what are shown in FIGS. 14A and 7C, except that no dielectric dummy fins 25' are formed, and protruding fins 24' are replaced by stacked layers 114 and 114'. The formation processes may be contemplated referring to the preceding embodiments.

Figure 21:
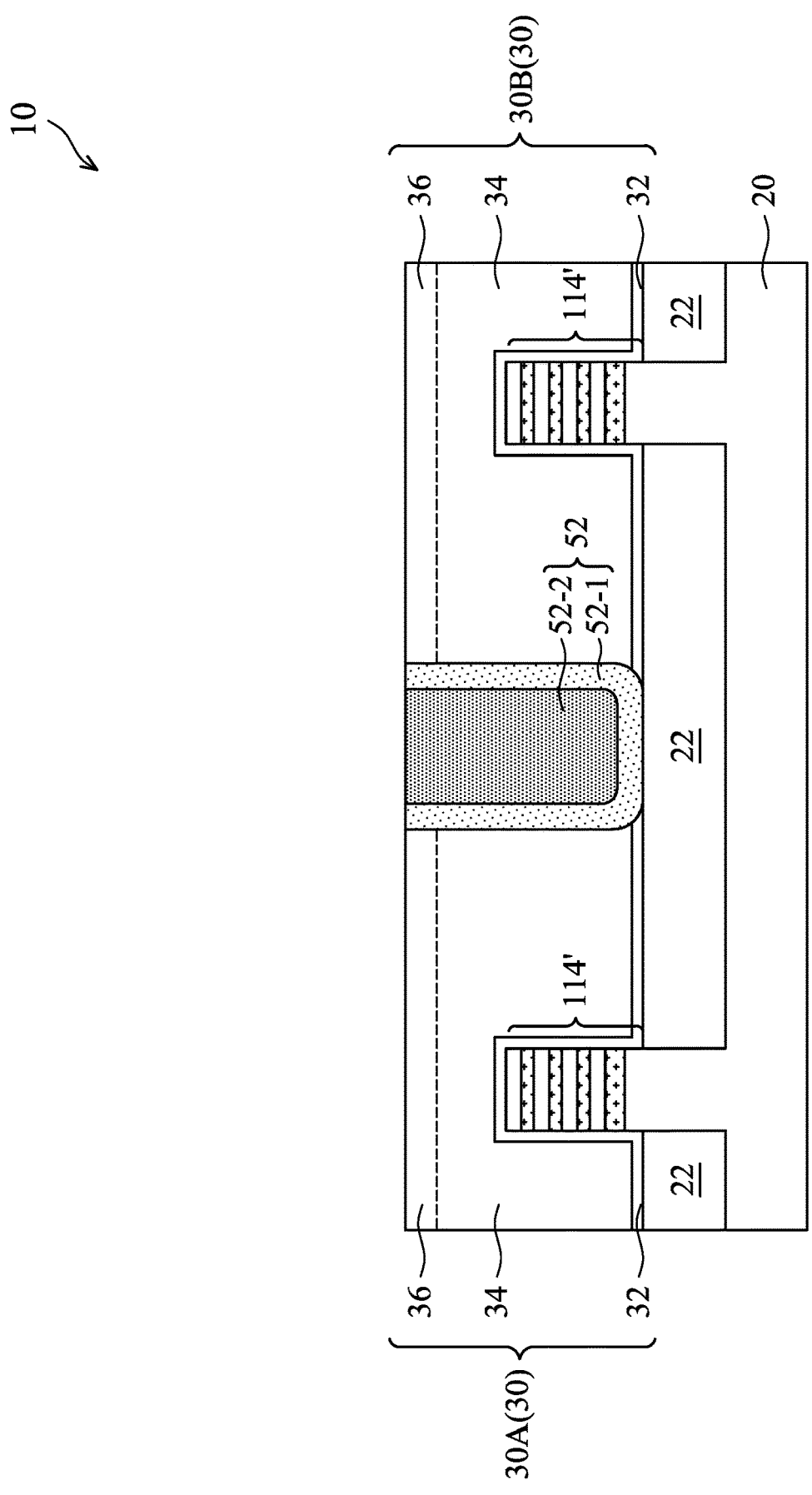
Figure 22:
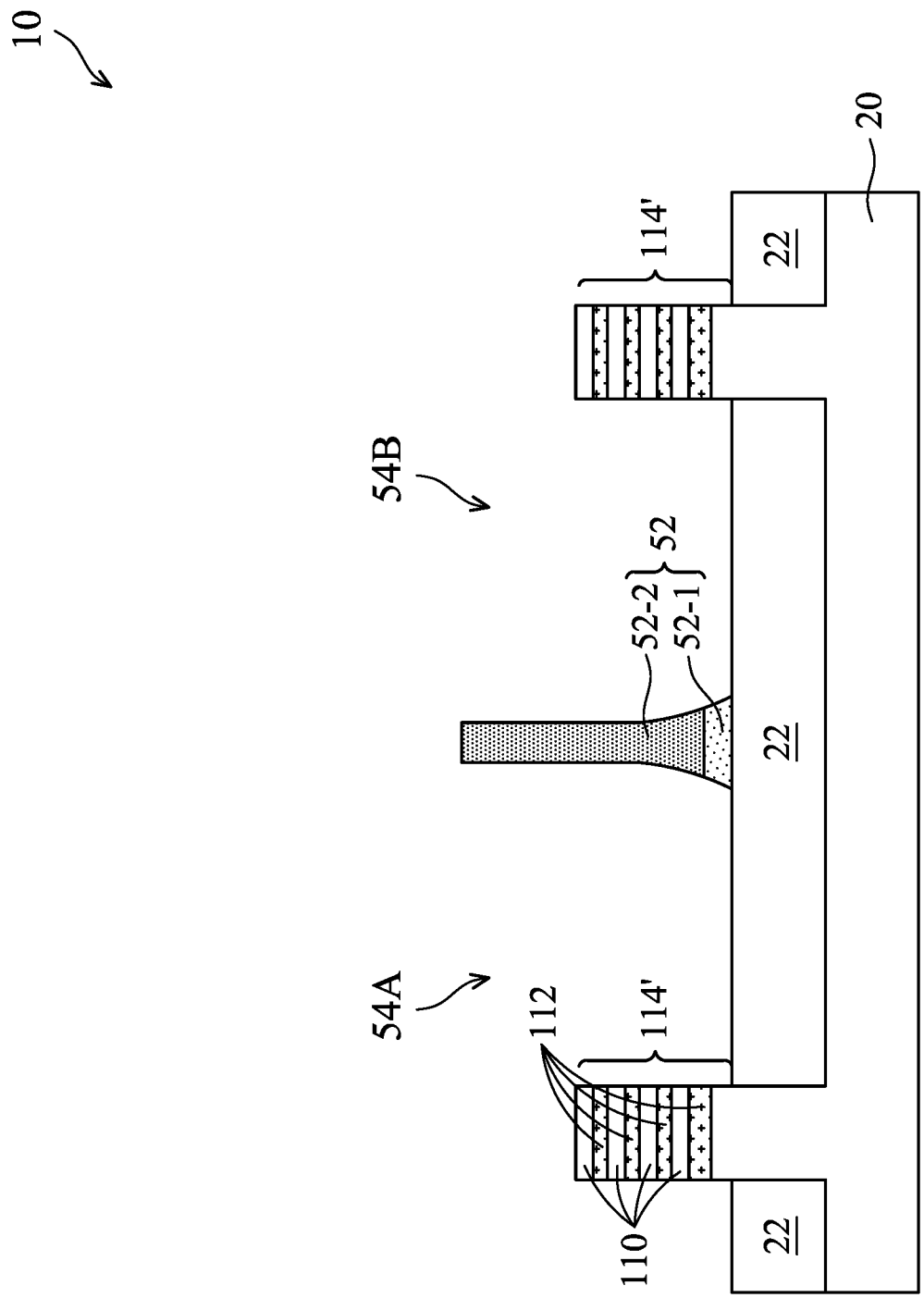
Figure 23:
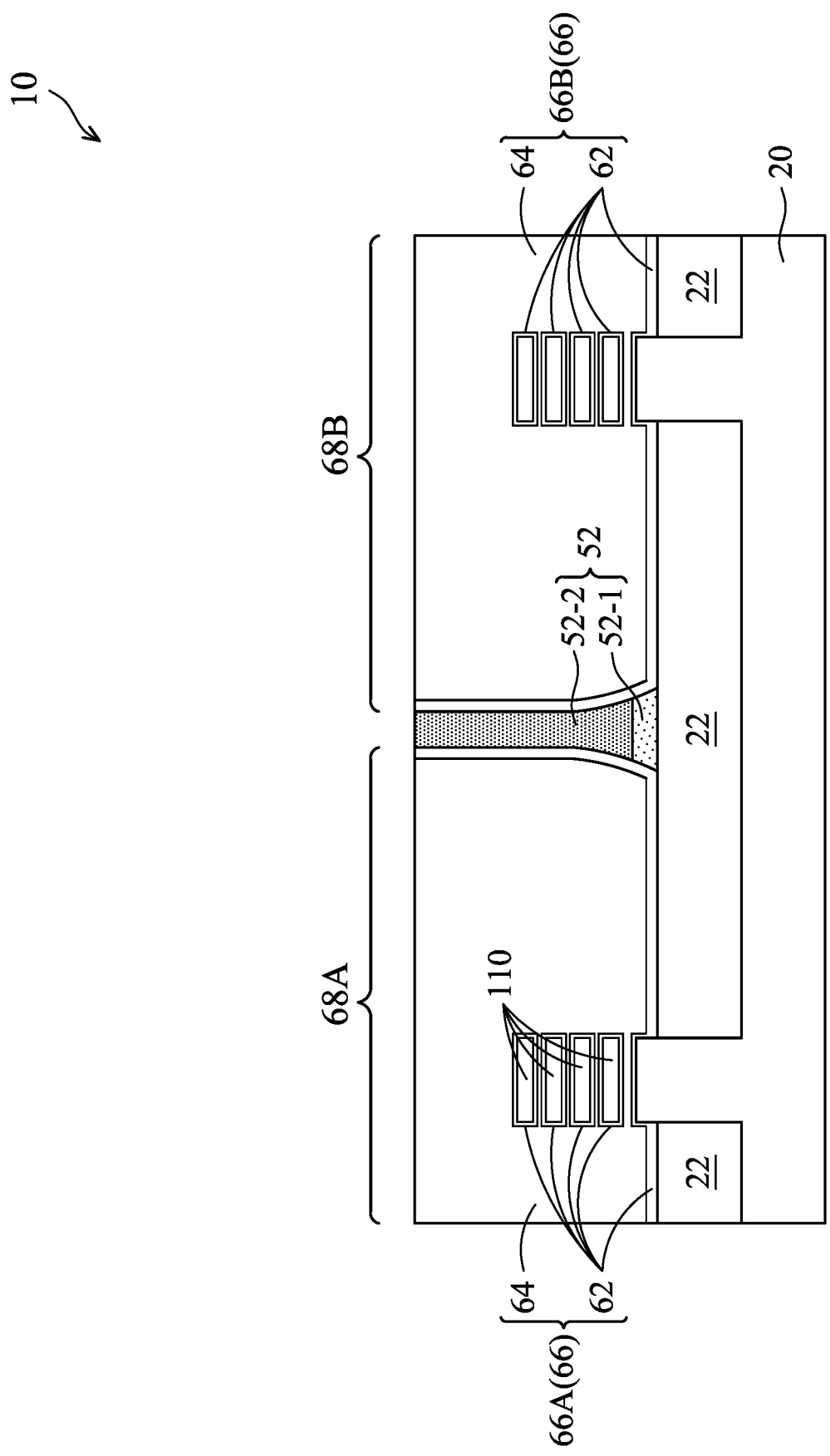

Referring to FIG. 21, gate isolation region 52 is formed. Dummy gate stacks 30A and 30B are then removed, resulting in trenches 54A and 54B, as shown in FIG. 22. In subsequent processes, the first etching process 56 (FIG. 17) and the second etching process 58 (FIG. 18) are performed to modify the profile of gate isolation region 52. The top-view shape of the structure shown in FIG. 22 is similar to what is shown in FIG. 11B, except that the protruding fins 24' in FIG. 11B are replaced by stacked layers 114 as in FIG. 22.

In subsequent processes, sacrificial films 112 are removed, followed by the formation of replacement gates 66A and 66B, which includes gate dielectrics 62 encircling channel layers 110, and gate electrodes 64 filling the remaining spaces between channel layers 110. GAA transistors 68A' and 68B' are thus formed.

Figure 25:
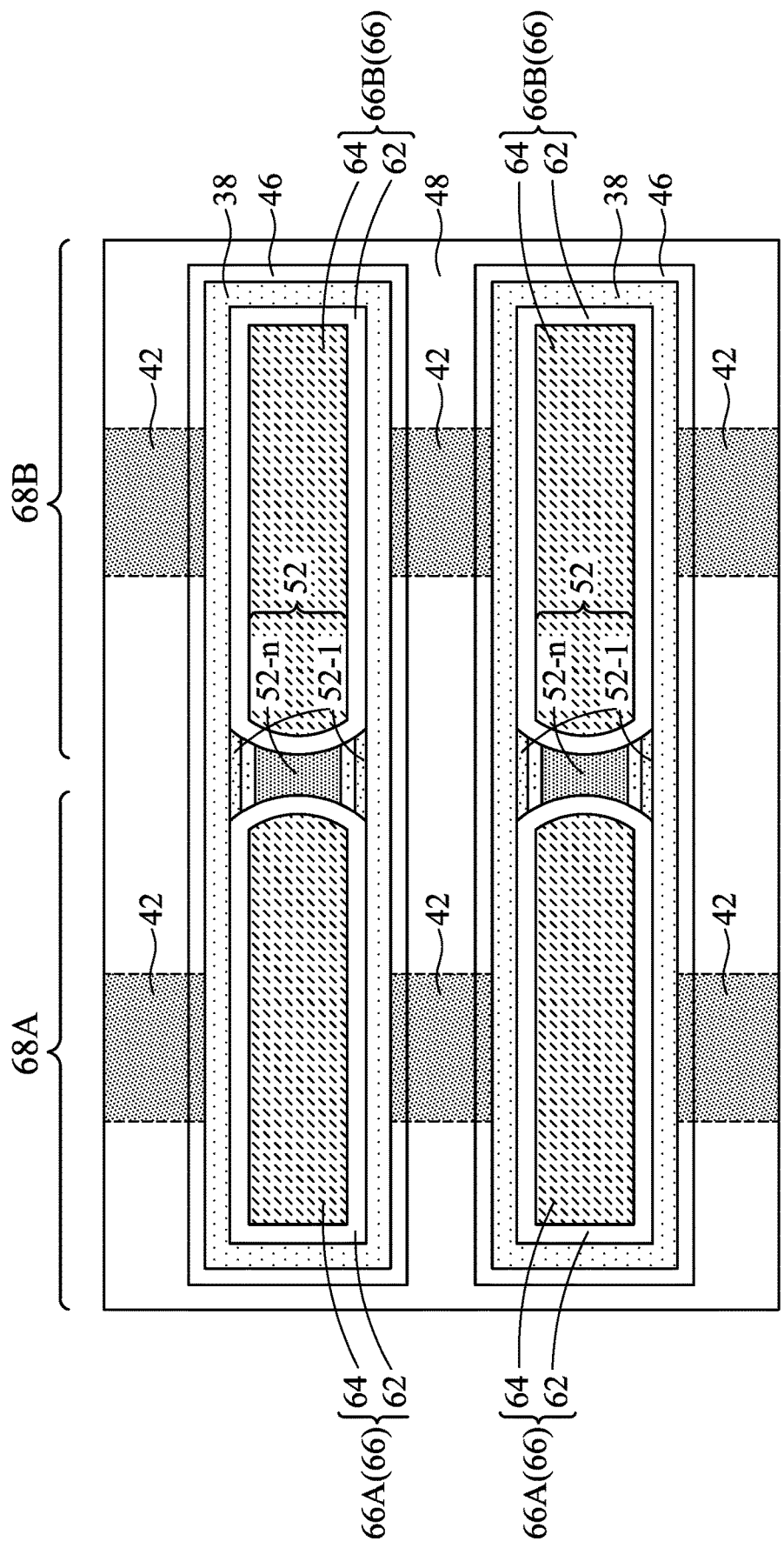

In accordance with some embodiments of the present disclosure, gate isolation region 52 includes two layers such as layers 52-1 and 52-2. In accordance with alternative embodiments, gate isolation region 52 may include more layers such as three, four, five, and up to ten layers. For example, FIG. 24 illustrates a top view of gate isolation regions 52, which include layer 52-1, layer 52-n, and the layers 52-2 through 52-(n−1) (not shown), with integer n being equal to or greater than 2, and equal to or smaller than 10, for example. The formation process includes depositing layers 52-1 through 52-(n−1) using conformal deposition methods, with the materials of the layers 52-1 through layer 52-n being different from each other, depositing dielectric layer 52-n, and performing a planarization process. FIG. 25 illustrates a top view of transistors 68A and 68B after gate isolation regions 52 are formed. The profile is similar to what are discussed referring to FIG. 11B, with the outer layers of gate isolation region 52 being increasingly wider than the respective inner layers.

The embodiments of the present disclosure have some advantageous features. By forming multi-layer gate isolation regions, and etching the multiple layers, the profiles of the corner regions of the gate isolation regions are shaped, with no undercut and sharp corners being formed. The formation of replacement gates is thus easier, and it is less likely to have voids being formed.

In accordance with some embodiments of the present disclosure, a method includes forming a dummy gate stack; etching the dummy gate stack to form an opening; depositing a first dielectric layer extending into the opening; depositing a second dielectric layer on the first dielectric layer and extending into the opening; performing a planarization process to form a gate isolation region comprising the first dielectric layer and the second dielectric layer; removing portions of the dummy gate stack on opposing sides of the gate isolation region to form trenches; performing a first etching process to remove sidewall portions of the first dielectric layer; performing a second etching process to thin the second dielectric layer; and forming replacement gates in the trenches. In an embodiment, in the first etching process, the first dielectric layer has a higher etching rate than the second dielectric layer, and in the second etching process, the first dielectric layer has a lower etching rate than the second dielectric layer. In an embodiment, the first etching process and the second etching process results in the gate isolation region to have concave sidewalls facing the trenches. In an embodiment, the method further includes forming a dielectric dummy fin protruding out of isolation regions that are on opposing sides of the dielectric dummy fin, and the gate isolation region has a bottom surface contacting the dielectric dummy fin. In an embodiment, the method further includes forming a shallow trench isolation region extending into a semiconductor substrate, wherein the gate isolation region has a bottom surface contacting the shallow trench isolation region. In an embodiment, the dummy gate stack extends on two neighboring semiconductor fins. In an embodiment, the dummy gate stack extends on two neighboring stacks of stacked layers, and each stack of the stacked layers comprises alternating channel layers and sacrificial films, and the method further comprising removing the sacrificial films.

In accordance with some embodiments of the present disclosure, a structure includes a first semiconductor region and a second semiconductor region; a first gate stack and a second gate stack on the first semiconductor region and the second semiconductor region, respectively; a dielectric region between the first semiconductor region and the second semiconductor region; and a gate isolation region between the first gate stack and the second gate stack, wherein a bottom surface of the gate isolation region contacts the dielectric region, and wherein in a plane view of the gate isolation region, the gate isolation region has concave sidewalls in contact with the first gate stack and the second gate stack. In an embodiment, the structure further includes a first gate spacer and a second gate spacer on opposing sides of, and contacting, the gate isolation region. In an embodiment, each of the first gate spacer and the second gate spacer further contacts the first gate stack and the second gate stack. In an embodiment, the gate isolation region has a bottom part in contact with the dielectric region, and wherein upper portions of the bottom part are narrower than respective lower portions of the bottom part. In an embodiment, the gate isolation region comprises a first dielectric layer and a second dielectric layer. The first dielectric layer comprises a bottom portion, and two sidewall portions over and connecting to opposing ends of the bottom portion. The second dielectric layer is between the two sidewall portions. In an embodiment, the first dielectric layer and the second dielectric layer are formed of different materials. In an embodiment, the first dielectric layer and the second dielectric layer are formed of a same material, and the first dielectric layer and the second dielectric layer have different porosity values.

In accordance with some embodiments of the present disclosure, a structure includes a first gate stack and a second gate stack. The first gate stack includes a first gate dielectric; and a first gate electrode overlapping a first bottom portion of the first gate dielectric. The second gate stack includes a second gate dielectric; and a second gate electrode overlapping a second bottom portion of the second gate dielectric. The structure further includes a first gate spacer; and a gate isolation region between the first gate stack and the second gate stack, wherein the gate isolation region comprises a first dielectric layer comprising a bottom portion, and two sidewall portions over and connected to opposing ends of the bottom portion, wherein the first dielectric layer forms a first interface with the first gate stack, and a second interface with the first gate spacer, and the first interface and the second interface form an acute angle; and a second dielectric layer between the two sidewall portions. In an embodiment, the structure further comprises a second gate spacer, wherein both of the first gate spacer and the second gate spacer are in contact with the gate isolation region. In an embodiment, the first dielectric layer and the second dielectric layer are formed of different materials. In an embodiment, the first dielectric layer and the second dielectric layer are formed of a same material and have different density values. In an embodiment, both of the first dielectric layer and the second dielectric layer are in contact with both of the first gate stack and the second gate stack. In an embodiment, the structure further comprises a dielectric region underlying and contacting the gate isolation region, wherein the dielectric region forms a first interface with the gate isolation region, and the bottom portion of the first dielectric layer forms a second interface with the second dielectric layer, and the second interface is shorter than the first interface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
   forming a dielectric dummy fin protruding out of isolation regions, wherein the isolation regions are on opposing sides of the dielectric dummy fin;
   forming a dummy gate stack on the dielectric dummy fin;
   etching the dummy gate stack to form an opening;
   depositing a first dielectric layer extending into the opening;
   depositing a second dielectric layer on the first dielectric layer and extending into the opening;
   performing a planarization process to form a gate isolation region comprising the first dielectric layer and the second dielectric layer, wherein the gate isolation region has a bottom surface contacting the dielectric dummy fin;
removing portions of the dummy gate stack on opposing sides of the gate isolation region to form trenches;
performing a first etching process to remove sidewall portions of the first dielectric layer;
performing a second etching process to thin the second dielectric layer; and
forming replacement gates in the trenches.

2. The method of claim 1, wherein in the first etching process, the first dielectric layer has a higher etching rate than the second dielectric layer, and in the second etching process, the first dielectric layer has a lower etching rate than the second dielectric layer.

3. The method of claim 1, wherein the first etching process and the second etching process results in the gate isolation region to have concave sidewalls facing the trenches.

4. The method of claim 1, wherein the replacement gates contact opposite sidewalls of the dielectric dummy fin.

5. The method of claim 1, wherein the dummy gate stack extends on two neighboring semiconductor fins.

6. The method of claim 1, wherein the dummy gate stack extends on two neighboring stacks of stacked layers, and each stack of the stacked layers comprises alternating channel layers and sacrificial films, and the method further comprising removing the sacrificial films.

7. The method of claim 2, wherein the first etching process and the second etching process are separate processes, and wherein the second etching process is performed after the first etching process.

8. A structure comprising:
a semiconductor substrate;
isolation regions extending into the semiconductor substrate;
a dielectric dummy fin between the isolation regions and protruding higher than top surfaces of the isolation regions;
a first semiconductor region and a second semiconductor region on opposing sides of the dielectric dummy fin;
a first gate stack and a second gate stack on the first semiconductor region and the second semiconductor region, respectively; and
a gate isolation region between the first gate stack and the second gate stack, wherein a bottom surface of the gate isolation region contacts a top surface of the dielectric dummy fin.

9. The structure of claim 8 further comprising a first gate spacer and a second gate spacer on opposing sides of, and contacting, the gate isolation region.

10. The structure of claim 9, wherein each of the first gate spacer and the second gate spacer further contacts the first gate stack and the second gate stack.

11. The structure of claim 8, wherein the gate isolation region has a bottom part in contact with the dielectric region, and wherein upper portions of the bottom part are narrower than respective lower portions of the bottom part.

12. The structure of claim 11, wherein the gate isolation region comprises:
a first dielectric layer comprising:
a bottom portion; and
two sidewall portions over and connecting to opposing ends of the bottom portion; and
a second dielectric layer between the two sidewall portions.

13. The structure of claim 12, wherein the first dielectric layer and the second dielectric layer are formed of different materials.

14. The structure of claim 12, wherein the first dielectric layer and the second dielectric layer are formed of a same material, and the second dielectric layer is more porous than the first dielectric layer.

15. A structure comprising:
a first gate stack comprising:
a first gate dielectric; and
a first gate electrode overlapping a first bottom portion of the first gate dielectric;
a second gate stack comprising:
a second gate dielectric; and
a second gate electrode overlapping a second bottom portion of the second gate dielectric;
a first gate spacer; and
a gate isolation region between the first gate stack and the second gate stack, wherein the gate isolation region comprises:
a first dielectric layer comprising a bottom portion, and two sidewall portions over and connected to opposing ends of the bottom portion, wherein the first dielectric layer forms a first interface with the first gate stack, and a second interface with the first gate spacer, and the first interface and the second interface form an acute angle; and
a second dielectric layer between the two sidewall portions, wherein the first dielectric layer and the second dielectric layer are formed of a same material and have different density values.

16. The structure of claim 15 further comprising a second gate spacer, wherein both of the first gate spacer and the second gate spacer are in contact with the gate isolation region.

17. The structure of claim 15, wherein both of the first dielectric layer and the second dielectric layer are in contact with both of the first gate stack and the second gate stack.

18. The structure of claim 15 further comprising a third dielectric layer between the first dielectric layer and the second dielectric layer.

19. The structure of claim 15, wherein the second dielectric layer has a higher porosity value than the first dielectric layer.

20. The structure of claim 15 further comprising a protruding dielectric dummy fin underlying and contacting the gate isolation region.

* * * * *